US008629690B2

(12) United States Patent  
Matsumoto et al.

(10) Patent No.: US 8,629,690 B2  
(45) Date of Patent: Jan. 14, 2014

(54) PROGRAMMABLE LOGIC DEVICE WITH LOGIC SWITCH AND MEMORIES

(75) Inventors: Mari Matsumoto, Yokohama (JP); Kosuke Tatsumura, Kawasaki (JP); Koichiro Zaitsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/605,646

(22) Filed: Sep. 6, 2012

(65) Prior Publication Data

US 2013/0241596 A1  Sep. 19, 2013

(30) Foreign Application Priority Data

Mar. 16, 2012 (JP) ................................. 2012-061160

(51) Int. Cl.
*H03K 19/173* (2006.01)
*G11C 11/34* (2006.01)
*G11C 16/04* (2006.01)

(52) U.S. Cl.
USPC .................... 326/38; 365/185.05; 365/185.15

(58) Field of Classification Search
USPC ........ 326/37–41, 44, 47; 365/185.05, 185.07, 365/185.17, 185.18
See application file for complete search history.

(56) References Cited

U.S. PATENT DOCUMENTS

| 5,812,450 | A  |   | 9/1998  | Sansbury et al. |
|-----------|----|---|---------|------------------|
| 6,002,610 | A  | * | 12/1999 | Cong et al. ............... 365/185.05 |
| 6,970,383 | B1 | * | 11/2005 | Han et al. .................. 365/185.28 |
| 7,839,681 | B2 | * | 11/2010 | Wang et al. ............. 365/185.05 |
| 8,139,410 | B2 | * | 3/2012  | Ogura et al. ............. 365/185.05 |
| 8,432,186 | B1 | * | 4/2013  | Zaitsu et al. .................... 326/38 |
| 2012/0080737 | A1 |   | 4/2012  | Zaitsu et al. |

OTHER PUBLICATIONS

Tatsumura, Kosuke, et al., U.S. Appl. No. 13/469,867 titled "Nonvolatile Programmable Switches", filed May 11, 2012.

* cited by examiner

*Primary Examiner* — Shawki Ismail
*Assistant Examiner* — Dylan White
(74) *Attorney, Agent, or Firm* — Finnegan, Henderson, Farabow, Garrett & Dunner, L.L.P.

(57) ABSTRACT

One embodiment provides a programmable logic device in which a logic switch includes: a first memory having a first terminal connected to a first wire, a second terminal connected to a second wire, and a third terminal connected to a third wire; a second memory having a fourth terminal connected to the first wire, a fifth terminal connected to a fourth wire, and a sixth terminal connected to a fifth wire; and a pass transistor having a gate connected to the first terminal, and a source and a drain respectively connected to a sixth wire and a seventh wire. A source or drain of a first select gate transistor is connected the sixth wire, and a source or drain of a second select gate transistor is connected to the seventh wire.

15 Claims, 24 Drawing Sheets

PROGRAMMABLE LOGIC DEVICE WITH LOGIC SWITCH AND MEMORIES

CROSS-REFERENCE TO RELATED APPLICATION(S)

This application claims priority/priorities from Japanese Patent Application No. 2012-061160 filed on Mar. 16, 2012, the entire contents of which are incorporated herein by reference.

FIELD

Embodiments described herein relate generally to a programmable logic device.

BACKGROUND

Programmable logic switches are used in field programmable gate arrays (FPGAs) in which logical operation circuits and wiring circuits are reconfigurable. The programmable logic switch has a memory, and turns on/off according to data retained in the memory. As the memory, a volatile memory (e.g., a static random access memory) may be used. However, when such volatile memory is used, it is necessary to write data to the memory everytime the device is activated.

Thus, a nonvolatile memory may be used as the memory of the programmable logic switch. In such programmable logic switch, e.g., each cell includes two nonvolatile memory transistors, and one switching transistor (pass transistor). In order to write data to the nonvolatile memory transistor, e.g., a Fowler-Nordheim (FN) tunneling or a hot-carrier injection is employed. However, whichever the FN tunneling and the hot-carrier injection is employed, the gate insulating film of the pass transistor may be destroyed when writing data to the nonvolatile memory transistor.

DETAILED DESCRIPTION

Embodiments generally provide a programmable logic device, including:
a logic switch (e.g. a first cell in embodiment);
a first select gate transistor (e.g. a select gate transistor SG1$a$ in embodiment); and
a second select gate transistor (e.g. a select gate transistor SG1$b$ in embodiment),
wherein the logic switch includes:
a first memory (e.g. a memory transistor MT1$a$ and a memory string MS1$a$ in embodiment) having a first terminal (e.g. one of a source and a drain in embodiment) connected to a first wire (e.g. a note Q1 in embodiment) for sending an output signal thereto, a second terminal (e.g. the other of the source and the drain in embodiment) connected to a second wire (e.g. a bit line BL1$a$ in embodiment) for receiving an input signal therefrom, and a third terminal (e.g. a gate in embodiment) connected to a third wire (e.g. a word line WL1$a$ in embodiment);
a second memory (e.g. a memory transistor MT1$b$ and a memory string MS1$b$ in embodiment) having a fourth terminal (e.g. one of a source and a drain in embodiment) connected to the first wire for sending an output signal thereto, a fifth terminal (e.g. the other of the source and the drain in embodiment) connected to a fourth wire (e.g. a bit line BL1$b$ in embodiment) for receiving an input signal therefrom, and a sixth terminal (e.g. a gate in embodiment) connected to a fifth wire (e.g. a word line WL1$b$ in embodiment); and
a pass transistor (e.g. a pass transistor PT1 in embodiment) having a gate connected to the first terminal, and a source and a drain respectively connected to a sixth wire (e.g. a wire X1 in embodiment) and a seventh wire (e.g. a wire Y1 in embodiment),
wherein the first select gate transistor has a source and a drain respectively connected to an eighth wire (e.g. a wire XS1 in embodiment) and the sixth wire, and a gate connected to a ninth wire (e.g. a wire SL1 in embodiment), and
wherein the second select gate transistor has a source and a drain respectively connected to a tenth wire (e.g. a wire YS1 in embodiment) and the seventh wire, and a gate connected to an eleventh wire (e.g. a wire SL2 in embodiment).

First Embodiment

Figure 1:
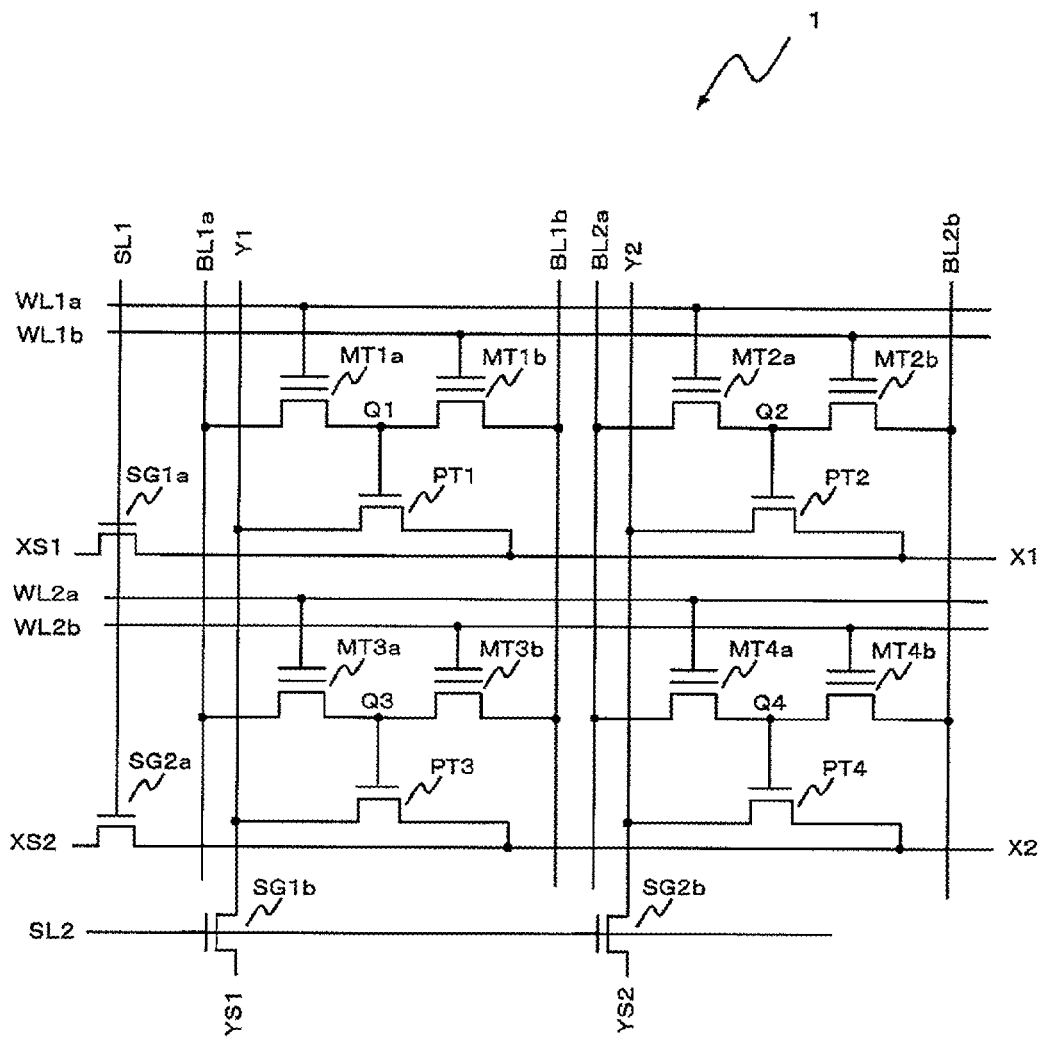
FIG. 1 illustrates a programmable logic device according to a first embodiment.

FIG. 1 illustrates a programmable logic device 1 according to a first embodiment. In the programmable logic device 1, cells are arranged like an array. Each cell includes two nonvolatile memory transistors (memory transistors) and one pass transistor, and functions as a logic switch. FIG. 1 illustrates four cells as an example. The four cells are hereinafter referred to as a first cell (i.e., a cell having memory transistors MT1$a$ and MT1$b$ and a pass transistor PT1), a second cell (i.e., a cell having memory transistors MT2$a$ and MT2$b$ and a pass transistor PT2), a third cell (i.e., a cell having memory transistors MT3$a$ and MT3$b$ and a pass transistor PT3), and a fourth cell (i.e., a cell having memory transistors MT4$a$ and MT4$b$ and a pass transistor PT4), respectively. In each of the first to fourth cells, the one pass transistor (PT1/PT2/PT3/PT4) is connected to the two memory transistors (MT1a and MT1b/MT2a and MT2b/MT3a and MT3b/MT4a and MT4b) at one node (Q1/Q2/Q3/Q4).

In the programmable logic device 1, the source and the drain of the pass transistor serve as input/output terminals of an associated one of the cells, and a transistor (select gate transistor) is provided at each of the source and the drain of the pass transistor. For example, as illustrated in FIG. 1, the source of the pass transistor PT1 and the drain of the select gate transistor SG1a are connected to a wire X1, and the drain of the pass transistor PT1 and the drain of the select gate transistor SG1b are connected to a wire Y1. A select gate transistor is commonly connected to the sources of the pass transistors of the cells arranged on the same row in the cell array. For example, the common select gate transistor SG1a is provided at the source of the pass transistor PT1 of the first cell and the source of the pass transistor PT2 of a second cell. And, a select gate transistor is commonly connected to the drains of the pass transistors of the cells arranged on the same column in the cell array. For example, the common select gate transistor SG1b is provided at the drain of the pass transistor PT1 of the first cell and the drain of the pass transistor PT3 of a third cell.

The memory transistor may be a floating gate (FG) type transistor using an electrically conductive floating gate as a charge storage film. Alternatively, the memory transistor may be a metal-oxide-nitride-oxide-semiconductor (MONOS) type transistor using an insulating film made of silicon nitride or silicon oxynitride as a charge storage film. A state where a large amount of electrons are stored in a charge storage film of a memory transistor, so that a threshold voltage Vth is high, is defined as a written state. A state where a small amount of electrons are stored in the charge storage film of the memory transistor, so that the threshold voltage Vth is low, is defined as an erased state.

(Write Mode)

There will be exemplified a case where the two memory transistors MT1a and MT1b of the first cell are initially in an erased state and data is written to one (e.g., the memory transistor MT1a) of them. In the present embodiment, data is complementarily written to the two memory transistors of one cell so that one of the memory transistors is in a written state, while the other memory transistor is in an erased state.

In the present embodiment, a first cell and a second cell share word lines WL1a and WL1b. Thus, when data is written to the memory transistors of the first cell, it is necessary to adjust a voltage to be applied to bit lines BL2a and BL2b such that data is not written to the memory transistors of the second cell. On the other hand, the bit lines of the first cell and the second cell are independent of each other.

Figure 2:
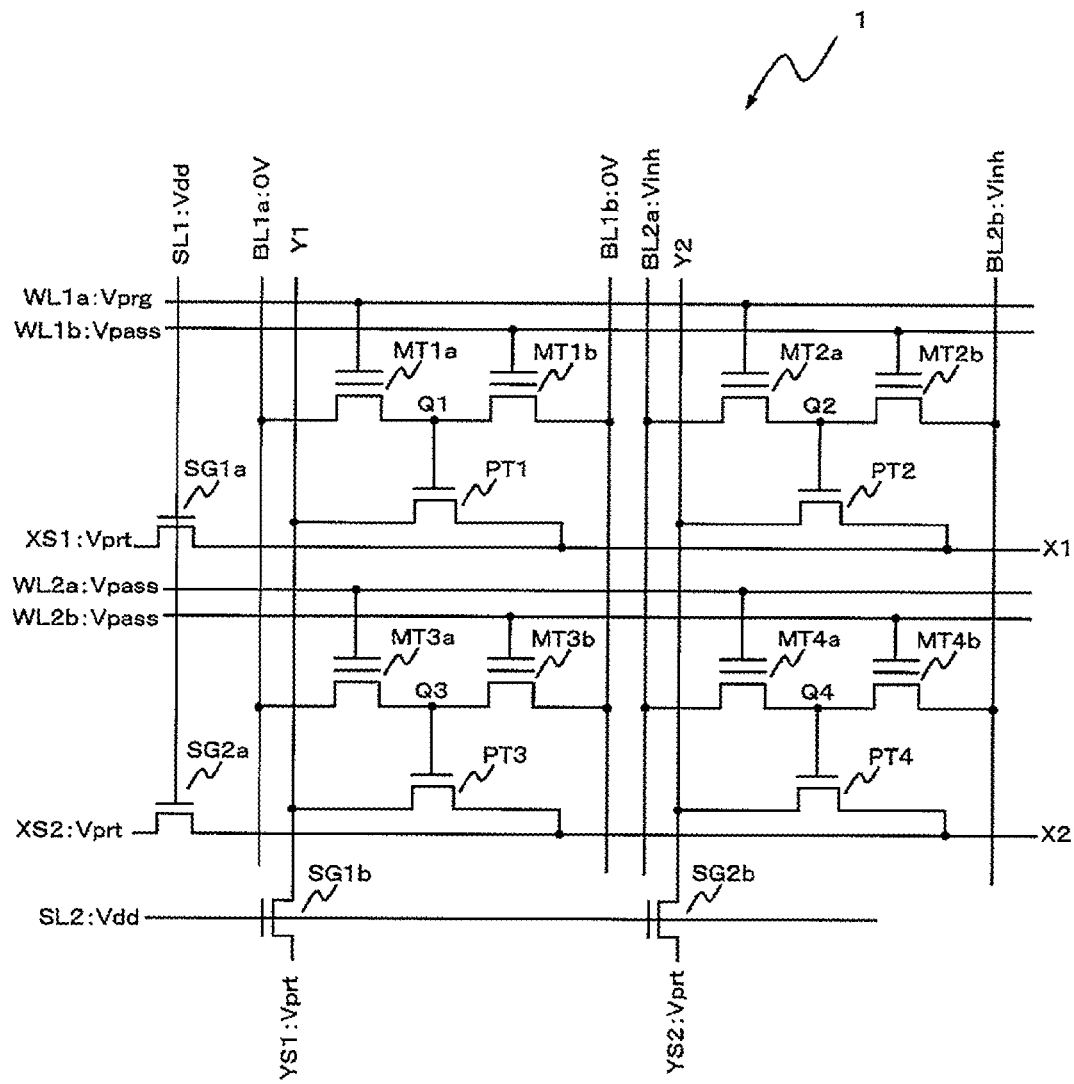
FIG. 2 illustrates voltages applied in a write mode.
Figure 3:
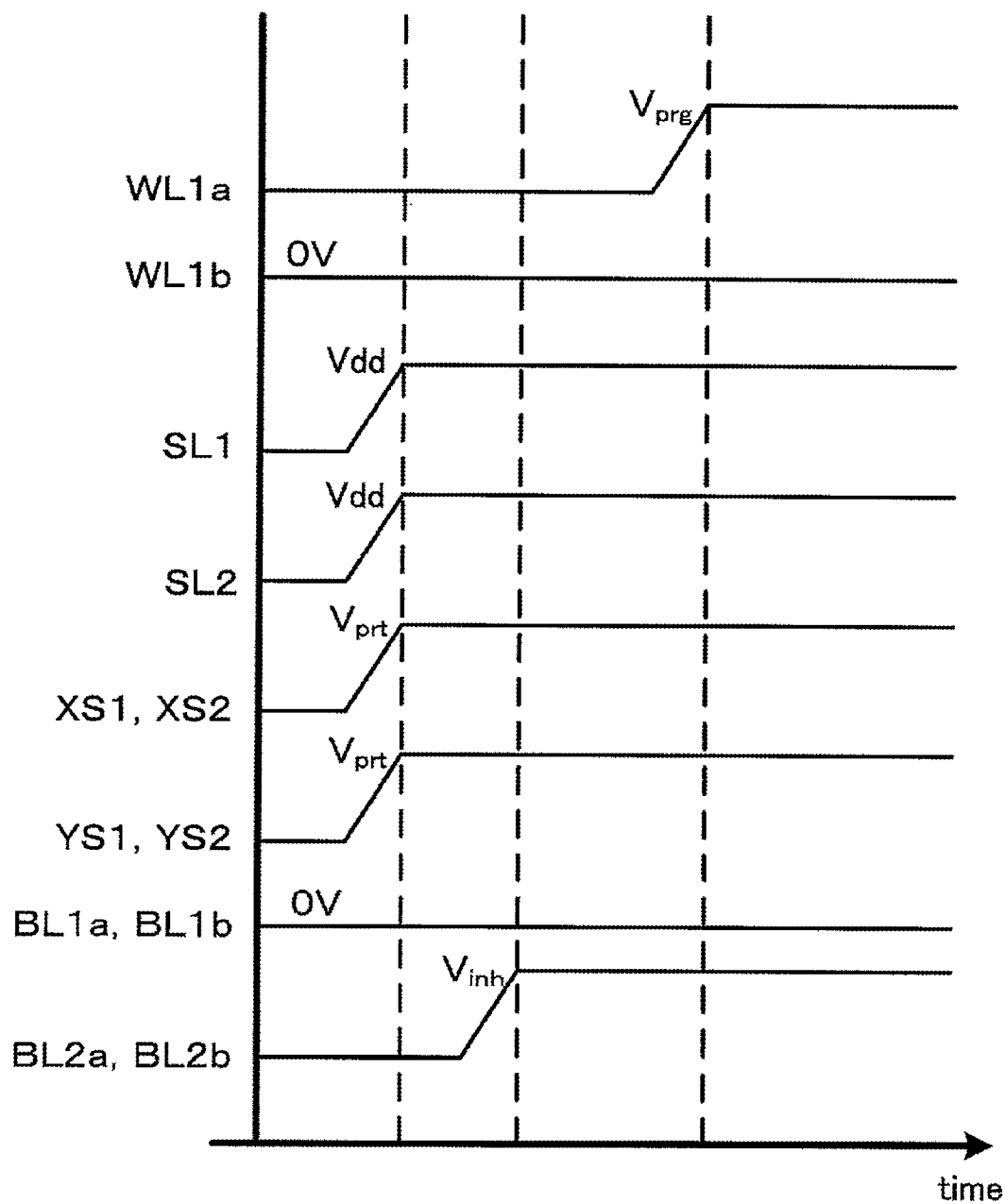
FIG. 3 illustrates voltage application timing in the write mode.

FIG. 2 illustrates voltages applied when writing data to one of the memory transistors of the first cell. FIG. 3 illustrates voltage application timings. First, a power supply voltage Vdd is applied to wires SL1 and SL2 to bring the select gate transistors SG1a, SG1b, SG2a and SG2b into ON-state. Then, a voltage (breakdown prevent voltage) $V_{prt}$ for preventing the breakdown of the gate insulating films of the pass transistors PT1 to PT4 is applied to the wires X1, X2, Y1 and Y2 from wires XS1, XS2, YS1 and YS2 via the select gate transistors SG1a, SG1b, SG2a and SG2b. Thus, the voltage at the source and the drain of each of the pass transistors PT1 to PT4 can be raised. Although an operation of the select gate transistor SG2a does not affect the first cell and the second cell, when data is written selectively to one of the memory transistors included in the programmable logic device 1, all the select gate transistors may be brought into ON-state.

Then, a voltage (write protect voltage) $V_{inh}$ for preventing writing is applied to the bit lines BL2a and BL2b connected to the memory transistors of the second cell. In addition, a voltage of 0 volts (V) is applied to bit lines BL1a and BL1b connected to the memory transistors of the first cell.

Finally, a write voltage $V_{prg}$ is applied to the word line WL1a connected to the gate of the writing-target memory transistor MT1a, while a voltage $V_{pass}$ is applied to the word line WL1b connected to the gate of the non-writing-target memory transistor MT1b. The voltage $V_{pass}$ is set to, e.g., 0V so that a channel is not formed.

As a result, a channel is formed in the memory transistor MT1a, so that a large voltage difference is caused between the channel and the gate. Electrons in the channel are injected into the charge storage film using FN tunnel current. Although a channel is also formed in the memory transistor MT2a of the second cell, a voltage difference caused between the channel and the gate is insufficient to write data using FN tunnel current, because the write protect voltage $V_{inh}$ is applied to the source and the drain of the memory transistor MT2a. Thus, data is not written to the memory transistor MT2a.

The voltage at the gate of each of the memory transistors MT1b and MT2b is 0V. Thus, no voltage difference is caused between the channel and the gate of each of the memory transistors MT1b and MT2b. Accordingly, no data is written to memory transistors MT1b and MT2b.

Incidentally, writing data to a third cell and a fourth cell can be inhibited by applying the voltage $V_{pass}$ to word lines WL2a and WL2b.

Thus, in the programmable logic device 1, data can be written selectively to one of two memory transistors included in one cell. In addition, writing data to a memory transistor which shares the same word line with the writing-target memory transistor can be inhibited.

Next, ranges of the write protect voltage $V_{inh}$ and the breakdown prevent voltage $V_{prt}$ are described. In order to prevent erroneous writing to a non-writing-target memory transistor, and the breakdown of the gate insulating film of each of the pass transistors PT1 to PT4, following conditions should be satisfied.

A first condition is that, in order to prevent the breakdown of the gate insulating film of the pass transistor, the gate insulating film needs to have a withstanding voltage equal to or higher than the difference between the write voltage $V_{prg}$ and the breakdown prevent voltage $V_{prt}$. In the following description, a thickness is represented in terms of $SiO_2$ thickness. The $SiO_2$ equivalent thickness $T(SiO_2)$ of the gate insulating film of the pass transistor is obtained as follows.

$$T(SiO_2) = T_{ox} * \epsilon(SiO_2)/\epsilon \qquad \text{(Expression 1)}$$

where $T_{ox}$ represents the actual thickness of the gate insulating film of the pass transistor, $\epsilon(SiO_2)$ represents the electric permittivity of $SiO_2$, and $\epsilon$ represents the electric permittivity of the gate insulating film of the pass transistor.

The write protect voltage $V_{inh}$ is applied to a bit line connected to the source of each memory transistor in a cell to which data is not written. In addition, the breakdown prevent voltage $V_{prt}$ is applied to the source and the drain of the pass transistor. That is, the voltage difference applied to the gate insulating film of the pass transistor of a cell to which data is not written is $(V_{inh} - V_{prt})$. The electric field $E_t$ is represented by the following expression.

$$E_t = (V_{inh} - V_{prt})/T(SiO_2) \qquad \text{(Expression 2)}$$

Assuming that the electric field at which the breakdown of the gate insulating film occurs is $E_{BK}$, $E_t$ should be lower than $E_{BK}$.

$$E_t \leq E_{BK} \quad \text{(Expression 3)}$$

As a second condition, the write protect voltage $V_{inh}$ to be applied to prevent erroneous writing to a cell to which data is not written will be considered. The write protect voltage $V_{inh}$ for the memory transistor is restricted by the following voltages, i.e., a minimum writing electric-field $E_{lim1}$ to be applied to the gate insulating film to write the memory transistor, and a maximum non-writing electric-field $E_{lim2}$ that can be applied to the gate insulating film when data is not written to the memory transistor. Specifically, the write protect voltage $V_{inh}$ needs to satisfy the following condition.

$$V_{inh} \geq (E_{lim1} - E_{lim2}) * T_M \quad \text{(Expression 4)}$$

where $T_M$ represents a sum-total thickness of the gate insulating film of the memory transistor. In the case of employing a memory transistor having an electrically conductive floating gate made of polysilicon and the like, $T_M$ represents a sum of the thickness of a tunnel film and the thickness of a block film. In the case of employing a memory transistor configured to capture electric-charges by an insulating film such as a silicon nitride film, $T_M$ represents a sum of the thickness of a tunnel film, the thickness of an electric charge capturing film, and the thickness of a block film.

In general flash memories, the difference between the electric fields $E_{lim1}$ and $E_{lim2}$ is about 5 megavolts/centimeters (MV/cm). A high voltage is applied to the gate insulating film of the pass transistor only when data is written to the memory transistor. For example, in a flash memory, the electric field applied to the tunnel insulating film is about 20 MV/cm. The upper limit (i.e., the electric field $E_{BK}$ at which the breakdown of the gate insulating film occurs) of the electric field applied to the gate insulating, film of the pass transistor is about 10 MV/cm.

In order to assure high-speed performance of a logic switch, preferably, the thickness of the gate insulating film of the bass transistor is several nanometers (nm). On the other hand, the sum-total thickness of the gate insulating film of the memory transistor is about 15 nm. For example, when the sum-total thickness of the gate insulating film of the memory transistor is 13 nm and the difference between $E_{lim1}$ and $E_{lim2}$ is 5 MV/cm, the write protect voltage $V_{inh}$ is obtained from Expression 4 to be equal to or more than 6.5 V. In addition, when the thickness of the gate insulating film of the pass transistor is 3 nm and the write protect voltage $V_{inh}$ is 6.5 V, the breakdown prevent voltage $V_{prt}$ is obtained from Expression 2 to be equal to or higher than 3.5 V. Thus, according to the gate insulating film of the memory transistor and the gate insulating film of the pass transistor, the write protect voltage $V_{inh}$ and the breakdown prevent voltage $V_{prt}$ can be determined.

(Operation Mode)

Figure 4:
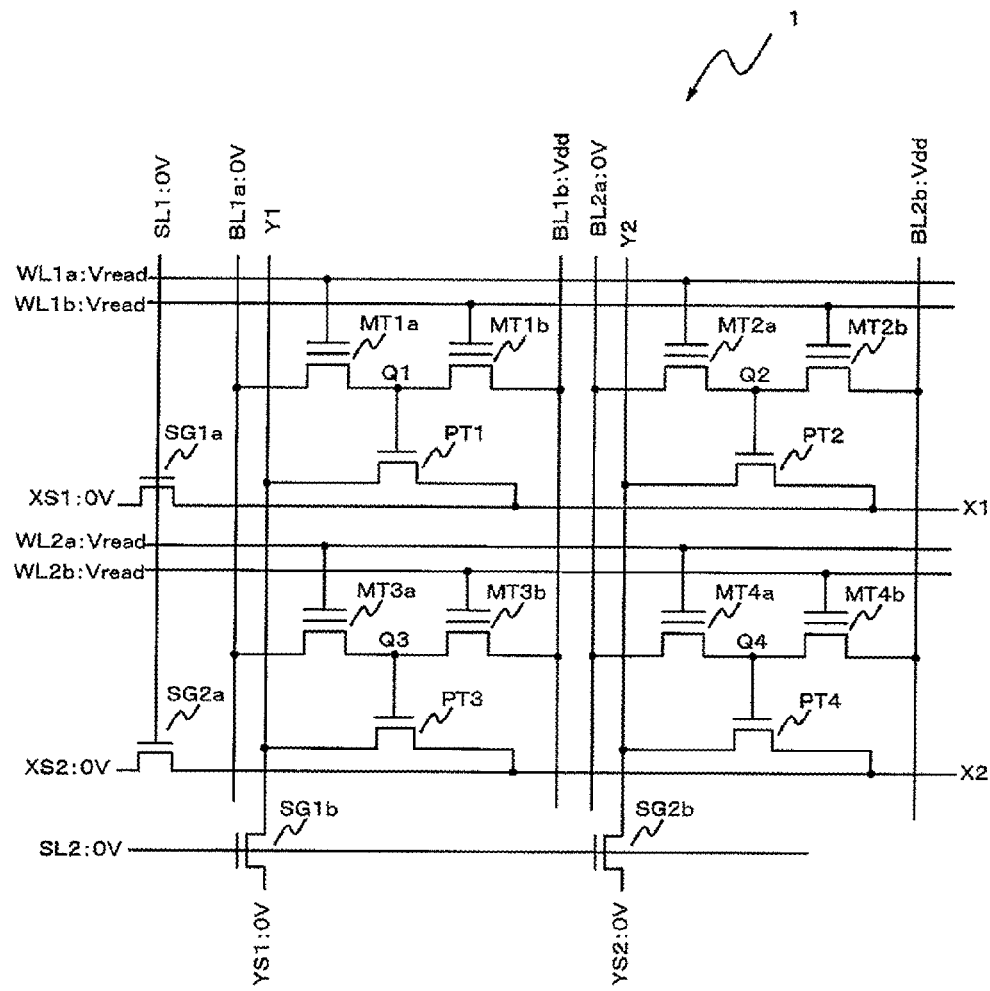
FIG. 4 illustrates voltages applied in an operation mode.

FIG. 4 illustrates voltages applied when the programmable logic device 1 is in an operation mode. When the programmable logic device 1 is in an operation mode, a voltage of 0 V is given to the wires SL1 and SL2 to bring the select gate transistors SG1a, SG1b, SG2a and SG2b into OFF-state. Then, a voltage of 0 V is given to one of the two bit lines connected to each cell, while a power-supply voltage Vdd is given to the other bit line. For example, as illustrated in FIG. 4, a voltage of 0 V is given to the bit lines BL1a and BL2a, while the power-supply voltage Vdd is given to the bit line BL1a and BL2b.

There will be exemplified voltages given to wires in a case where the memory transistor MT1a is in a written state and the memory transistor MT1b is in an erased state, by way of example. When a read voltage $V_{read}$ (which satisfies a relation: a threshold voltage in the erased state<$V_{read}$<a threshold voltage in the written state) is applied to the gates of the memory transistors MT1a and MT1b, the power-supply voltage Vdd is applied to the gate of the pass transistor PT1 via the memory transistor MT1b. Thus the pass transistor PT1 is brought into ON-state. When wires Y1 and Y2 are used for inputting signals and wires X1 and X2 are used for outputting signals, signals input to the wire Y1 are output to the wire X1 via the pass transistor PT1.

(Erasure Mode)

Figure 5:
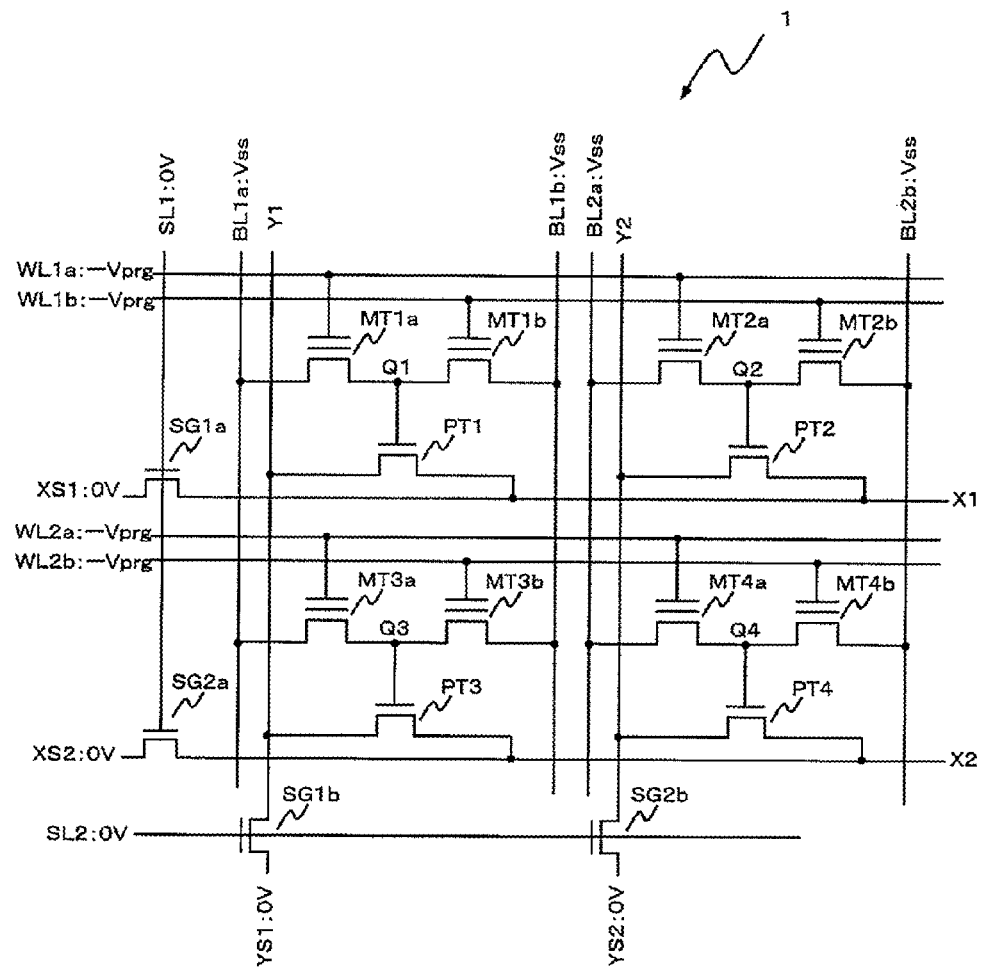
FIG. 5 illustrates voltages applied in an erasure mode.

FIG. 5 illustrates voltages applied when the programmable logic device 1 is in the erasure mode. In the erasure mode, all memory transistors included in the programmable logic device 1 are put into the erased state. Specifically, the select gate transistors SG1a, SG2a, SG1b and SG2b are brought into OFF-state. Then, a negative erasure voltage $-V_{prg}$ is applied to all the word lines WL1a, WL1b, WL2a and WL2b. In addition, a voltage $V_{ss}$ of, e.g., 0V is applied to all the bit lines BL1a, BL1b, BL2a and BL2b.

Second Embodiment

Figure 6:
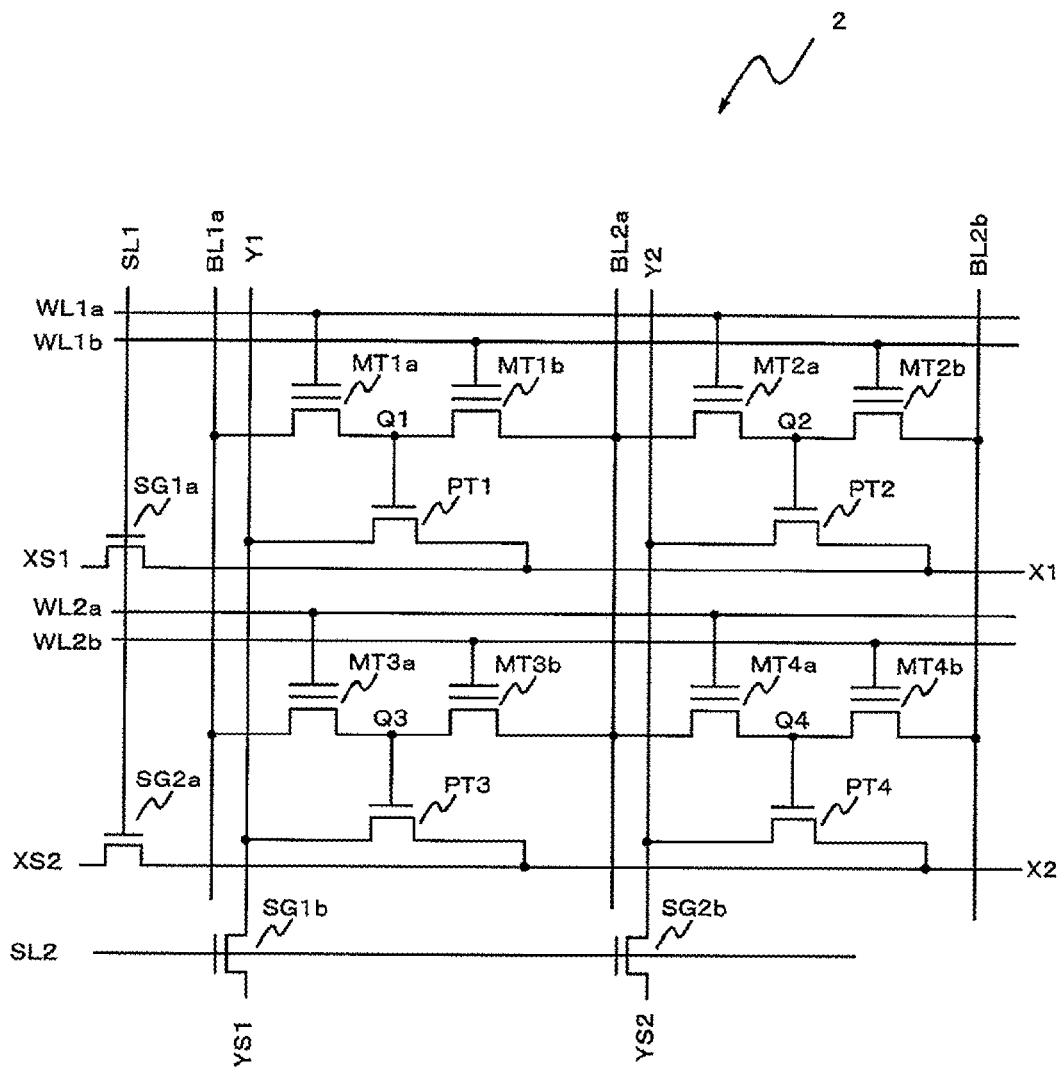
FIG. 6 illustrates a programmable logic device according to a second embodiment.

FIG. 6 illustrates a programmable logic device 2 according to a second embodiment. In the programmable logic device 2, cells each including two memory transistors and one pass transistor are arranged like an array. In the present embodiment, two adjacent cells (i.e., first and second cells/third and fourth cells) share a bit line. Other components are similar to those of the first embodiment. According to the second embodiment, because the adjacent two cells share a bit line, the chip area of the programmable logic device can be reduced.

(Write Mode)

There will be exemplified a write mode in a case where two memory transistors MT1a and MT1b of the first cell are initially in the erased state and data is written to one (e.g., the memory transistor MT1a) of them.

Figure 7:
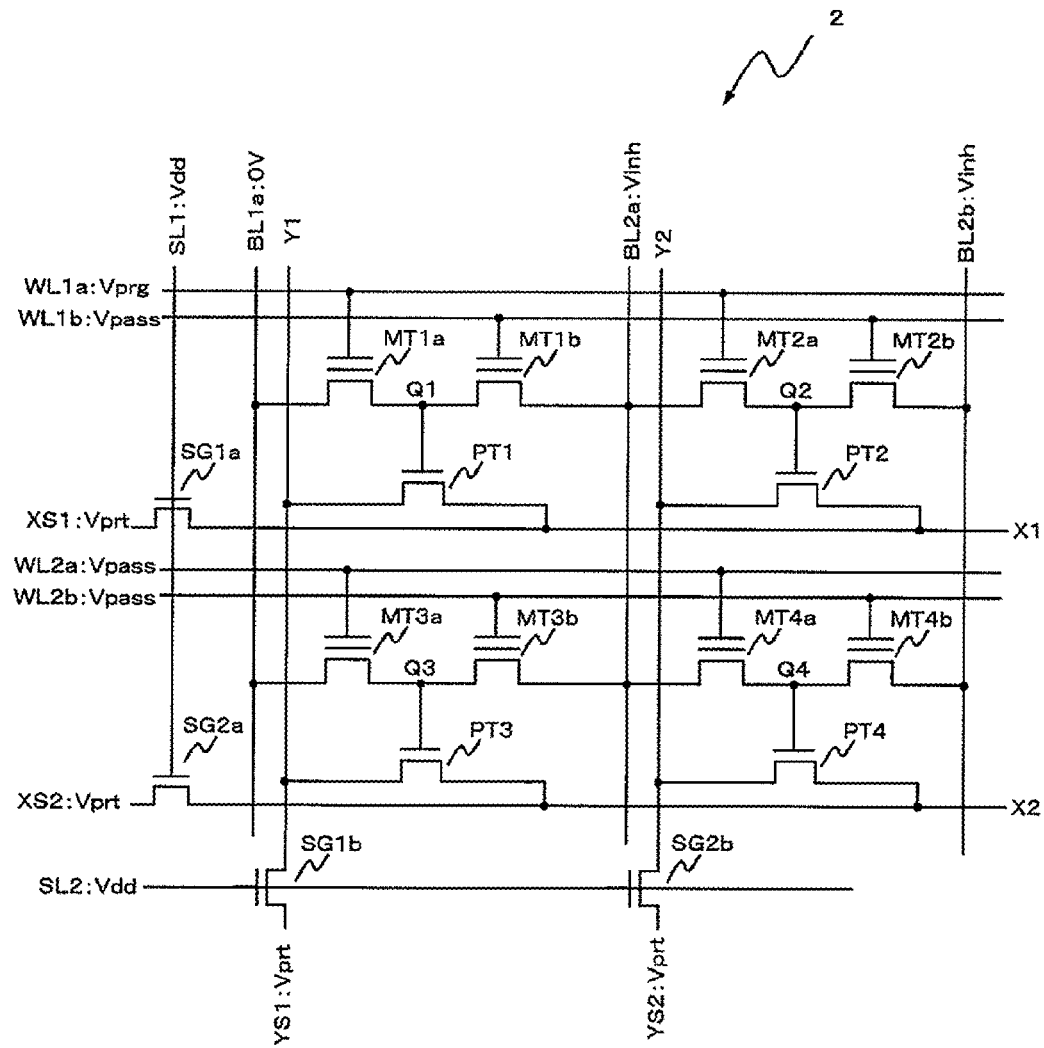
FIG. 7 illustrates voltages applied in a write mode.
Figure 8:
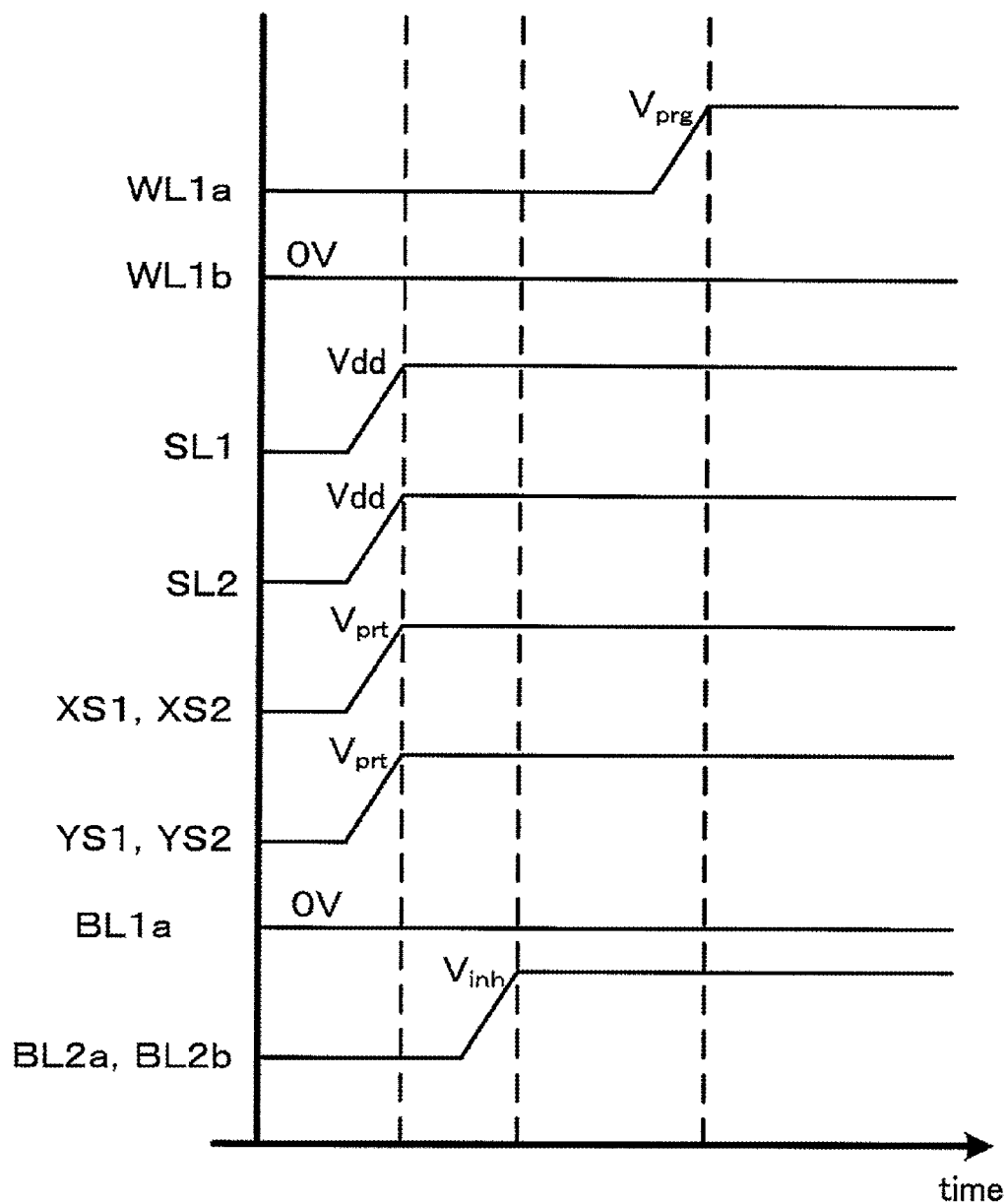
FIG. 8 illustrates voltage application timing in the write mode.

FIG. 7 illustrates voltages applied when writing data to one of the memory transistors of the first cell. FIG. 8 illustrates voltage application timings.

First, the power-supply voltage Vdd is given to the wires SL1 and SL2 to bring the select gate transistors SG1a, SG1b, SG2a and SG2b into ON-state. Then, the breakdown prevent voltage $V_{prt}$ is applied to the wires X1, X2, Y1 and Y2 from the wires XS1, XS2, YS1 and YS2 via the select gate transistors SG1a, SG1b, SG2a and SG2b. Consequently, the voltage at the source and the drain of each of the pass transistors PT1 to PT4 can be raised. Although an operation of the select gate transistor SG2a does not affect the first cell and the second cell, when data is written selectively to one of the memory transistors included in the programmable logic device 1, all the select gate transistors may be brought into ON-state.

Then, a write protect voltage $V_{inh}$ is applied to the bit lines BL2a and BL2b connected to the unselected second cell. In addition, a voltage of 0 V is applied to the bit line BL1a connected to the memory transistor of the first cell.

Finally, a write voltage $V_{prg}$ is applied to the word line WL1a connected to the gate of the writing-target memory transistor MT1a, while the voltage $V_{pass}$ is applied to the word line WL1b connected to the gate of the non-writing-target memory transistor MT1b.

As a result, a channel is formed in the memory transistor MT1a, so that a large voltage difference is caused between the channel and the gate. Electrons in the channel are injected into the charge storage film using FN tunnel current. Although a channel is also formed in the memory transistor MT2a of the second cell, a voltage difference caused between the channel and the gate is insufficient to write data using FN tunnel current, because the write protect voltage $V_{inh}$ is applied to the source and the drain of the memory transistor MT2a. Thus, data is not written to the memory transistor MT2a.

The voltage at the gate of each of the memory transistors MT1b and MT2b is 0 V. Thus, no voltage difference is caused between the channel and the gate of each of the memory transistors MT1b and MT2b. Accordingly, no data is written to memory transistors MT1b and MT2b. The ranges of the write protect voltage $V_{inh}$ and the breakdown prevent voltage $V_{prt}$ are similar to those according to the first embodiment.

However, according to the second embodiment, the two adjacent cells share the bit line. Thus, in the write mode, the write protect voltage $V_{inh}$ is applied to the source of the memory transistor MT2b, while the voltage $V_{pass}$ is applied to the gate thereof. Therefore, according to the difference between the write protect voltage $V_{inh}$ and the voltage $V_{pass}$, the memory transistor MT2b may be brought into ON-state. Therefore, the range in which selective writing is realized is narrowed.

(Operation Mode)

Figure 9:
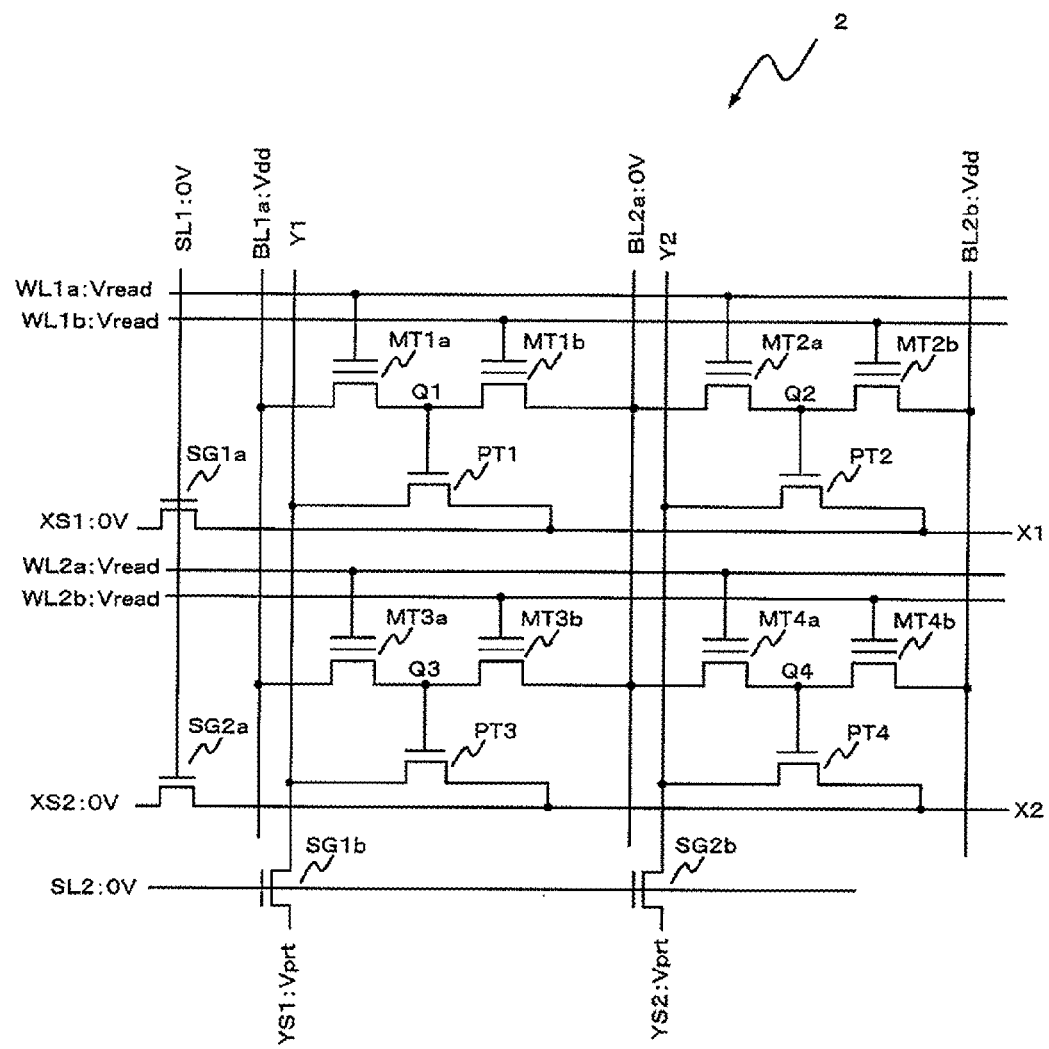
FIG. 9 illustrates voltages applied in an operation mode.

FIG. 9 illustrates voltages applied when the programmable logic device 2 is in an operation mode. When the programmable logic device 2 is in the operation mode, a voltage of 0 V is given to the wires SL1 and SL2 to bring the select gate transistors SG1a, SG1b, SG2a and SG2b into OFF-state. Then, a voltage of 0 V is given to one of two bit lines connected to each cell, while the voltage Vdd is given to the other bit line. In the present embodiment, because the two adjacent cells share a bitline, e.g., the voltage Vdd is applied to the bit line BL1a, a voltage of 0 V is applied to the bit line BL2a, and the voltage Vdd is applied to the bit line BL2b. Then, the programmable logic device 2 can be operated similarly to the first embodiment.

(Erasure Mode)

When the programmable logic device 2 is in an erasure mode, the select gate transistors SG1a, SG2a, SG1b and SG2b are brought into OFF-state, similarly to the first embodiment. Then, a negative erasure voltage $-V_{prg}$ is applied to all the word lines WL1a, WL1b, WL2a and WL2b. The voltage $V_{ss}$ of, e.g., 0V is applied to all the bit lines BL1a, BL2a and BL2b. Consequently, all the memory transistors included in the programmable logic device 2 can be brought into the erased state as in the first embodiment.

Third Embodiment

Figure 10:
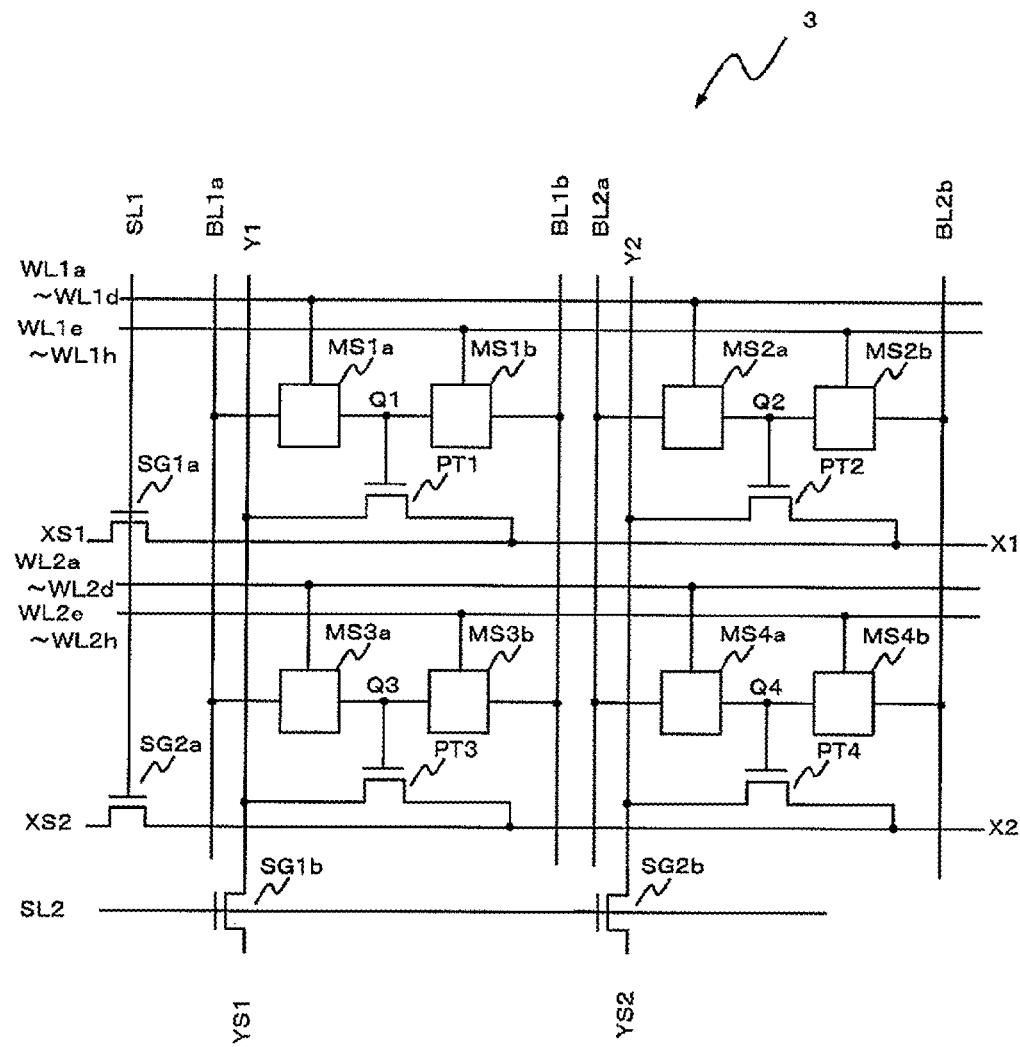
FIG. 10 illustrates a programmable logic device according to a third embodiment.
Figure 11:
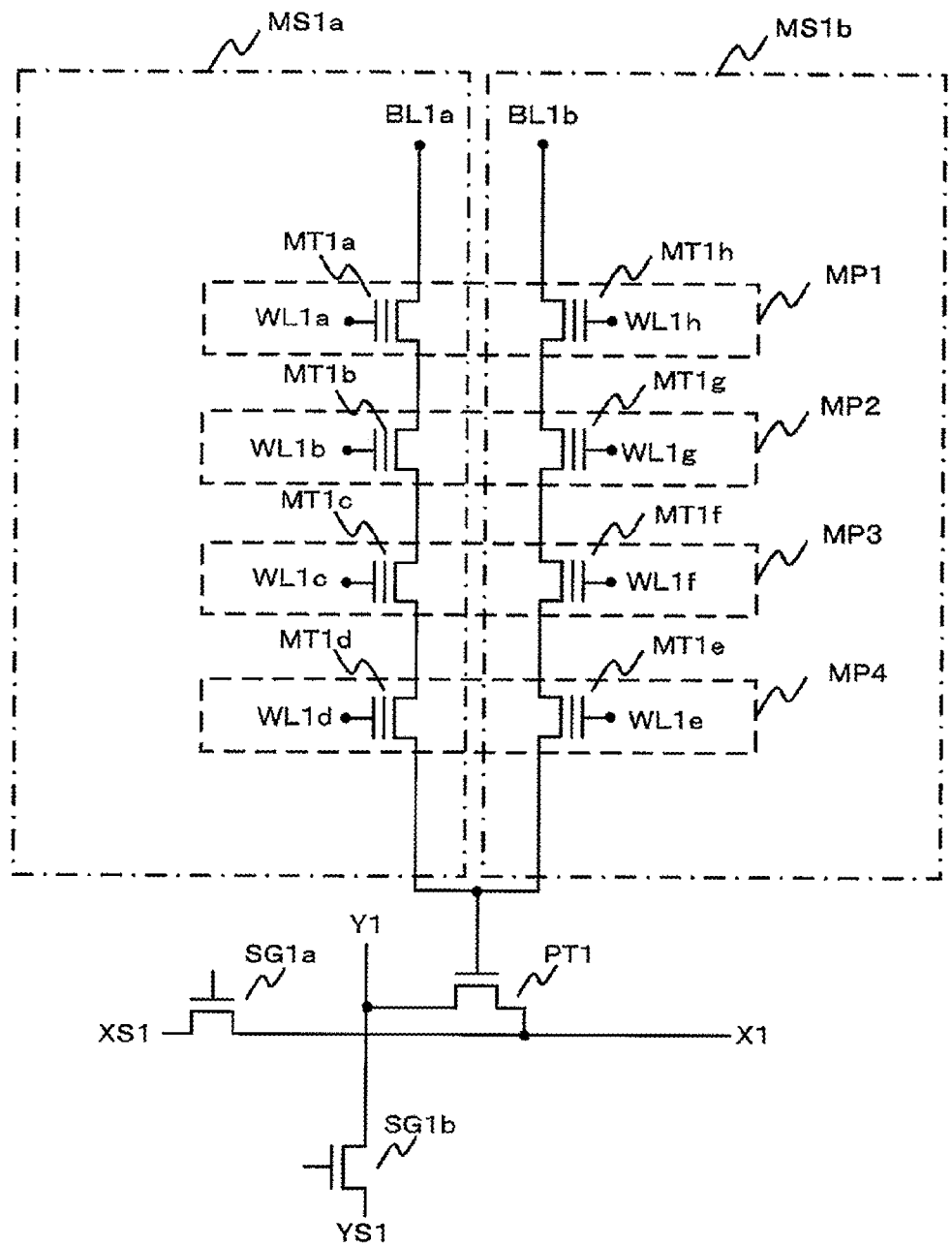
FIG. 11 illustrates a cell in the programmable logic device.

FIG. 10 illustrates a programmable logic device 3 according to the third embodiment. In the programmable logic device 3, one cell is configured by two memory strings each including plural memory transistors, and one pass transistor. FIG. 11 illustrates a first cell and select gate transistors SG1a and SG1b of the programmable logic device 3. Each of cells other than the first cell has a configuration similar to that of the first cell.

As illustrated in FIGS. 10 and 11, the first cell includes the memory strings MS1a and MS1b. Each of the memory strings MS1a and MS1b includes n of memory transistors (n is an integer equal to or larger than 2) which are series-connected such that the drain of one memory transistor is connected to the source of the adjacent other memory transistor. FIG. 11 illustrates the case where each of the memory strings MS1a and MS1b includes four series-connected memory transistors (MT1a to MT1d and MT1e to MT1h). One end of the memory string MS1a and one end of the memory string MS1b are connected to the bit lines BL1a and BL1b, respectively. The other end of the memory string MS1a and the other end of the memory string MS1b are connected to the gate of the pass transistor PT1.

Each memory transistor of the memory string MS1a is paired with an associated one of the memory transistors of the memory string MS1b according to distance from the pass transistor PT1. In FIG. 11, such memory transistor pairs MP1 to MP4 are illustrated by dashed-line boxes. The gates of the memory transistors MT1a to MT1h are connected to the word lines WL1a to WL1h, respectively. In addition, the first cell and the second cell share the word lines WL1a to WL1h.

Each memory transistor pair according to the present embodiment corresponds to two memory transistors included in one of the cells according to the first and second embodiments. That is, when data is written to the memory transistor pairs MP1 to MP4, the data is complementarily written thereto such that one of the paired memory transistors is in a written state, while the other memory transistor is in an erased state.

(Write Mode)

In a write mode, one of the memory transistor pairs is selected, and data is written to one of the memory transistor of the selected memory transistor pair. There will be exemplified a case where one MT1b of the memory transistors of the memory transistor pair MP2 is set in a written state and the other memory transistor MT1g is in the erased state.

Figure 12:
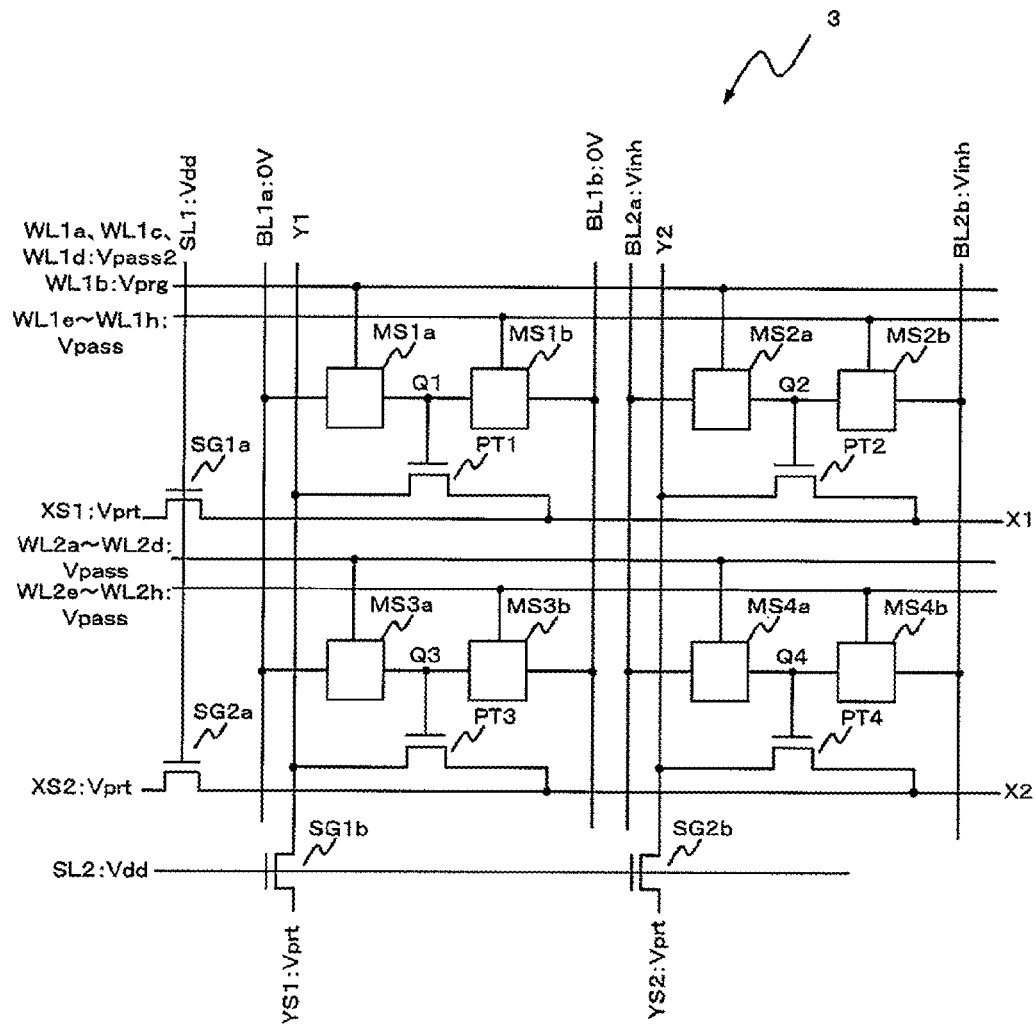
FIG. 12 illustrates voltages applied in a write mode.

FIG. 12 illustrates voltages applied in the write mode. In the present embodiment, data-writing is performed using FN tunnel current, similarly to the first and second embodiments. The power-supply voltage Vdd is given to the wires SL1 and SL2 to bring the selected gate transistor SG1a, SG1b, SG2a and SG2b into ON-state. Then, The breakdown prevent voltage $V_{prt}$ is applied to the wires X1, X2, Y1 and Y2 from the wires XS1, XS2, YS1 and YS2 via the select gate transistors SG1a, SG1b, SG2a and SG2b. Consequently, the voltage at the source and the drain of each of the pass transistors PT1 to PT4 can be raised. Also in the present embodiment, when the programmable logic device 3 is in the write mode, all the select gate transistors may be put into ON-state, and the breakdown prevent voltage $V_{prt}$ may be applied to the pass transistors.

Then, the write protect voltage $V_{inh}$ is applied to the bit lines BL2a and BL2b connected to the unselected second cell. A voltage of 0 V is applied to the bit lines BL1a and BL1b connected to the memory transistors of the first cell.

The voltage $V_{pass2}$ is applied to the word lines WL1a, WL1c and WL1d connected to the memory transistors MT1a, MT1c and MT1d of the memory string MS1a other than the writing-target memory transistor MT1b. The voltage $V_{pass2}$ is a voltage at which data-writing does not occur even when the memory transistor is in ON-state. The voltage $V_{pass}$ is applied to the word lines WL1e to WL1h of the memory string MS1b and word lines WL2a to WL2h connected to the third cell and the fourth cell.

Finally, the write voltage $V_{prg}$ is applied to the word line WL1b connected to the gate of the writing-target memory transistor MT1b. Consequently, a channel is formed in the memory transistor MT1b. Due to a large voltage difference caused between the channel and the gate, electrons in the channel are injected into the charge storage film using FN tunnel current. On the other hand, because the voltage $V_{pass}$ is applied to the gate of each memory transistor of the memory string MS1*b*, no channel is formed, so that data-writing does not occur.

Although a channel is also formed in the memory transistor of the second cell to which the word line WL1*b* is connected, because the write protect voltage $V_{inh}$ is applied to the source and the drain thereof, a voltage difference required to write data using FN tunnel current is not caused between the channel and the gate. Consequently, data is not written thereto.

(Operation Mode)

Figure 13:
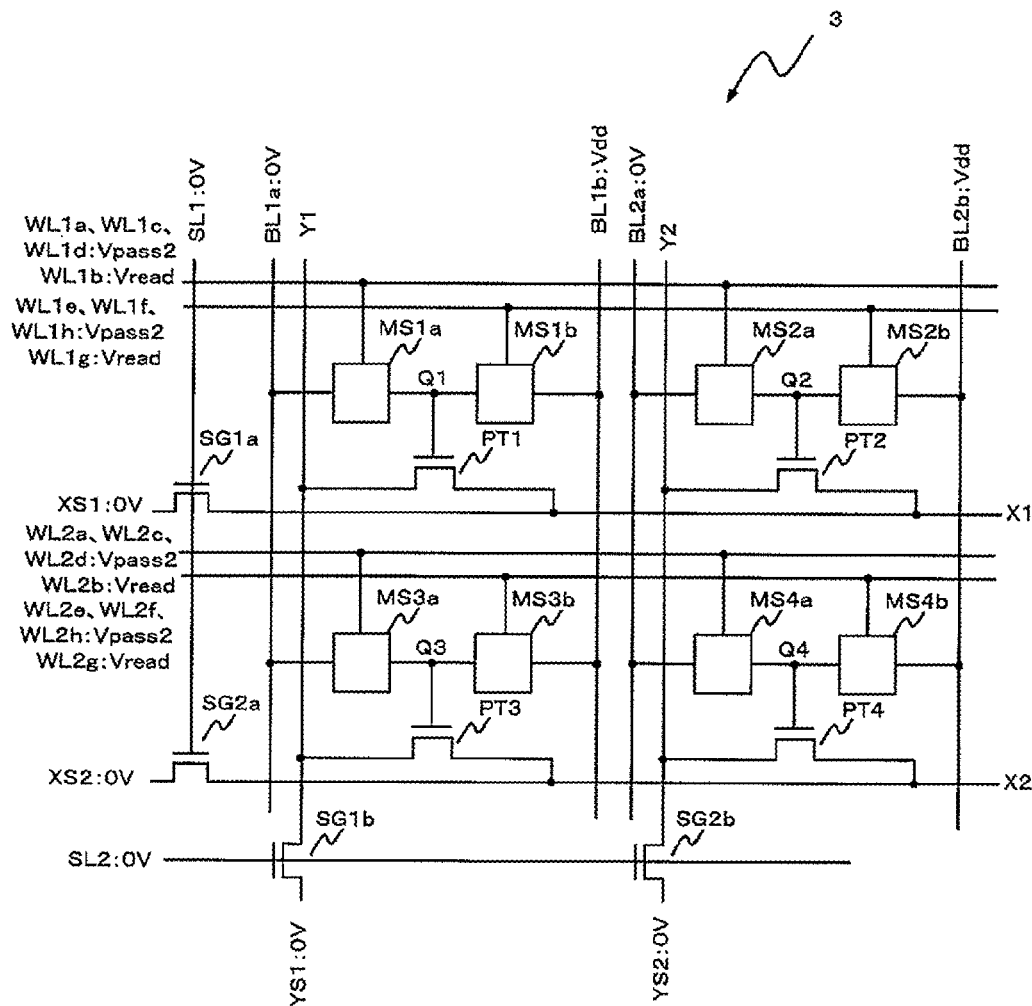
FIG. 13 illustrates voltages applied in an operation mode.

FIG. 13 illustrates voltages applied when the programmable logic device 3 is in an operation mode in a case where the memory transistor pair MP2 is selected. When the programmable logic device 3 is in an operation mode, a voltage of 0 V is given to the wires SL1 and SL2 to bring the select gate transistors SG1*a*, SG1*b*, SG2*a* and SG2*b* into OFF-state. In addition, a voltage of 0 V is given to one of the two bit lines connected to each cell, while the power-supply voltage Vdd is given to the other bit line.

There will be exemplified a case where the memory transistor MT1*b* of the first cell is in the written state and the memory transistor MT1*g* is in the erased state. The voltage $V_{pass2}$ is applied to the word lines WL1*a*, WL1*c*, WL1*d*, WL1*e*, WL1*f* and WL1*h* connected to the unselected memory transistor pairs MP1, MP3 and MP4. Then, the read voltage $V_{read}$ is applied to the word lines WL1*b* and WL1*g* connected to the memory transistor pair MP2. Then, the memory transistor MT1*b* is put into OFF-state, while the memory transistor MT1*g* is ON-state. Thus, the power-supply voltage Vdd is applied to the gate of the pass transistor PT1, so that the pass transistor PT1 is put into ON-state. Consequently, a signal input to the wire Y1 is output to the wire X1 via the pass transistor PT1.

(Erasure Mode)

When the programmable logic device 3 is in an erasure mode, the select gate transistors SG1*a*, SG2*a*, SG1*b* and SG2*b* are put into OFF-state, similarly to the first embodiment. Then, the negative erasure voltage $-V_{prg}$ is applied to all the wordlines WL1*a* to WL1*h* and WL2*a* to WL2*h*, while the voltage $V_{ss}$ of, e.g., 0V is applied to all the bit lines BL1*a*, BL1*b*, BL2*a* and BL2*b*. Accordingly, all the memory transistors included in the programmable logic device 3 can be put into an erased state.

[Modification of Third Embodiment]

Figure 14:
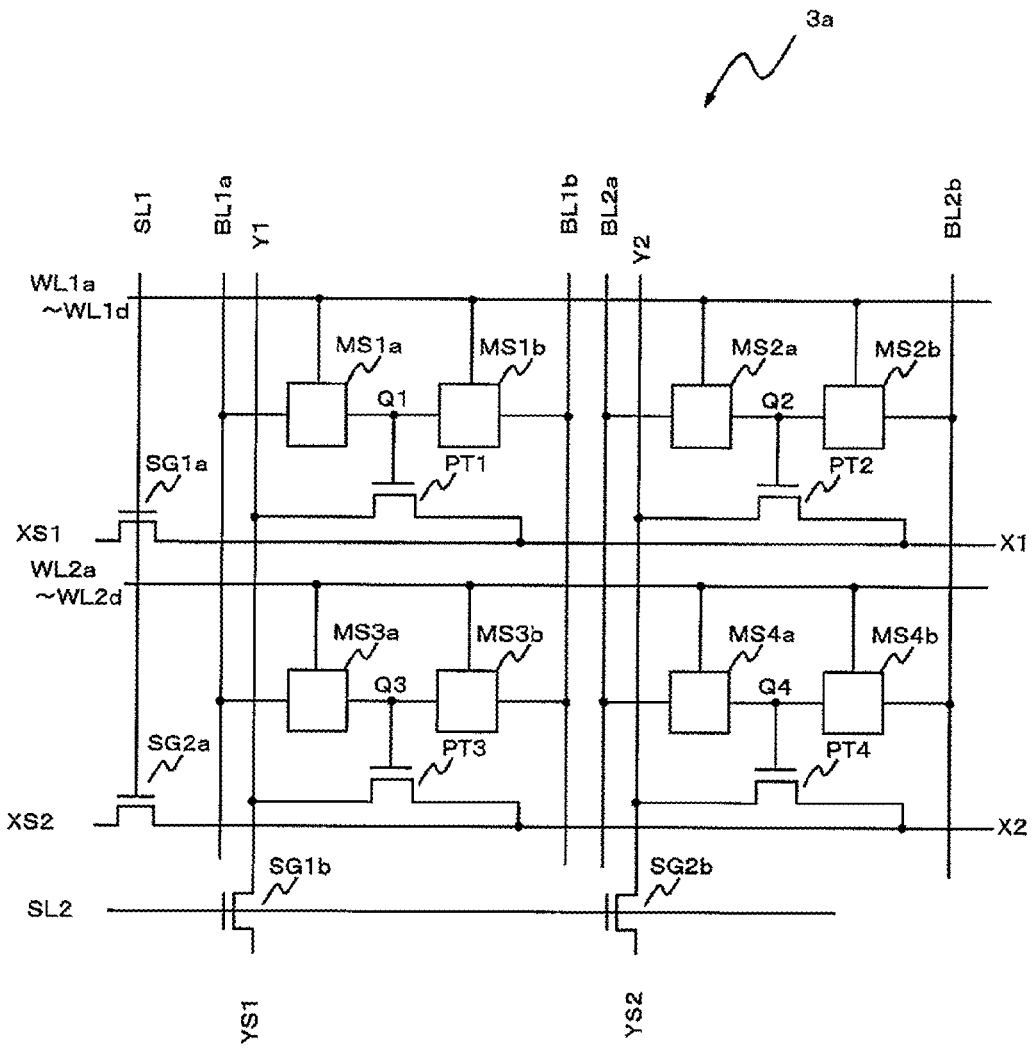
FIG. 14 illustrates a programmable logic device according to a modification of the third embodiment.
Figure 15:
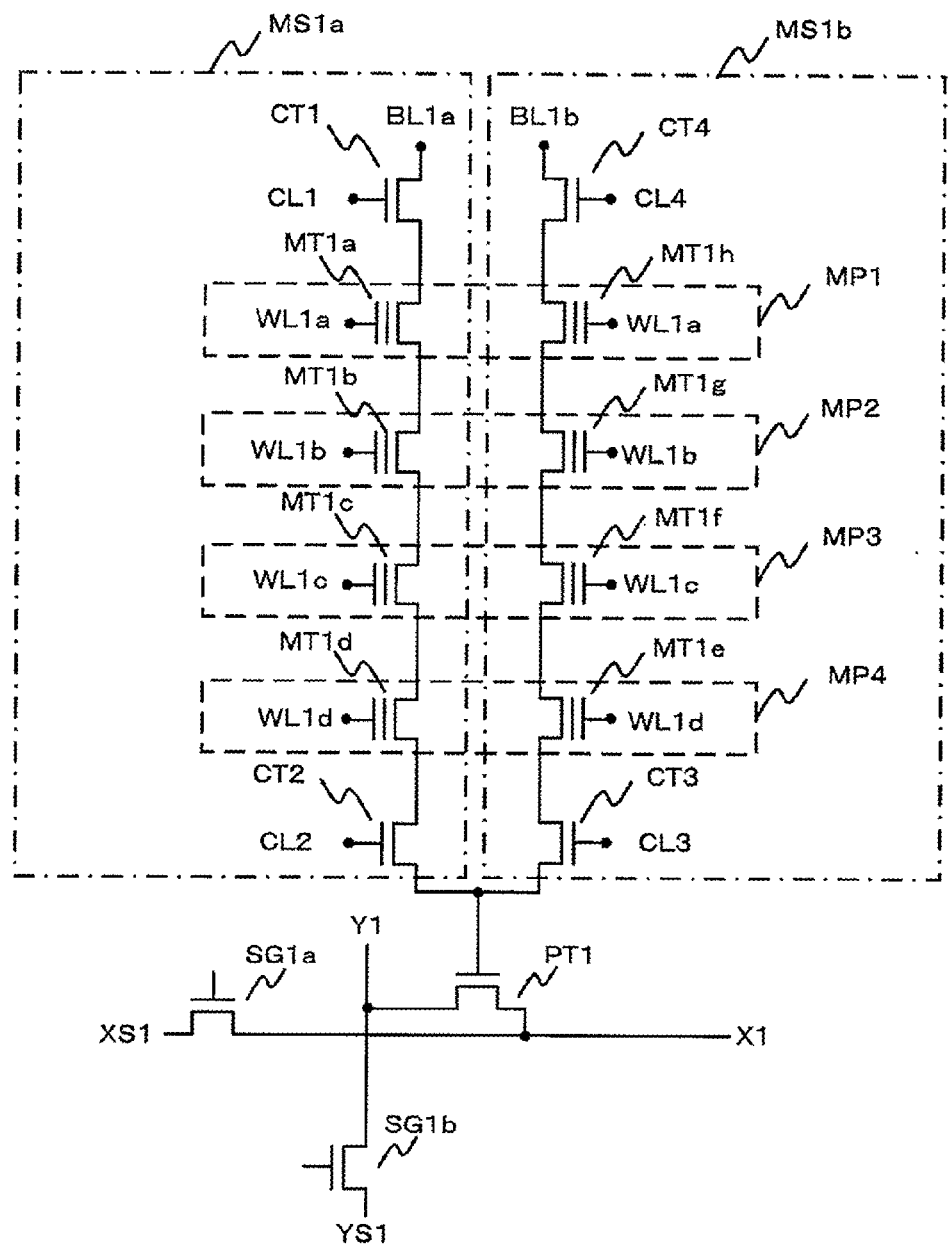
FIG. 15 illustrates a cell in the programmable logic device.

Word lines connected to the gates of the paired memory transistors may be common thereto. FIG. 14 illustrates a programmable logic device 3*a* according to a modification of the third embodiment. FIG. 15 illustrates a first cell and the select gate transistors SG1*a* and SG1*b* of the programmable logic device 3*a*. Cells other than the first cell have configurations similar to the configuration of the first cell.

As illustrated in FIGS. 14 and 15, the memory strings MS1*a* and MS1*b* of the programmable logic device 3*a* have controls transistor CT1 to CT4. The control transistors CT1 and CT4 are series-connected to the memory transistors connected in series and also connected to the bit lines BL1*a* and BL1*b*, respectively. The control transistors CT2 and CT3 are series-connected to the memory transistors connected in series and also connected to the gate of the pass transistor PT1. The control transistors CT2 and CT3 are provided to prevent the breakdown of the gate insulating film of the pass transistor during data-writing. However, because the breakdown of the gate insulating film of the pass transistor can be prevented by providing the select gate transistors SG1*a* and SG1*b*, the control transistors CT2 and CT3 may be omitted.

(Write Mode)

In a write mode, one of the memory transistor pairs of a cell is selected. Data is written to one of the memory transistors of the selected memory transistor pair. There will be exemplified a case where one MT1*b* of the memory transistors of the memory transistor pair MP2 is put into a written state, while the other memory transistor MT1*g* is put into an erased state.

Figure 16:
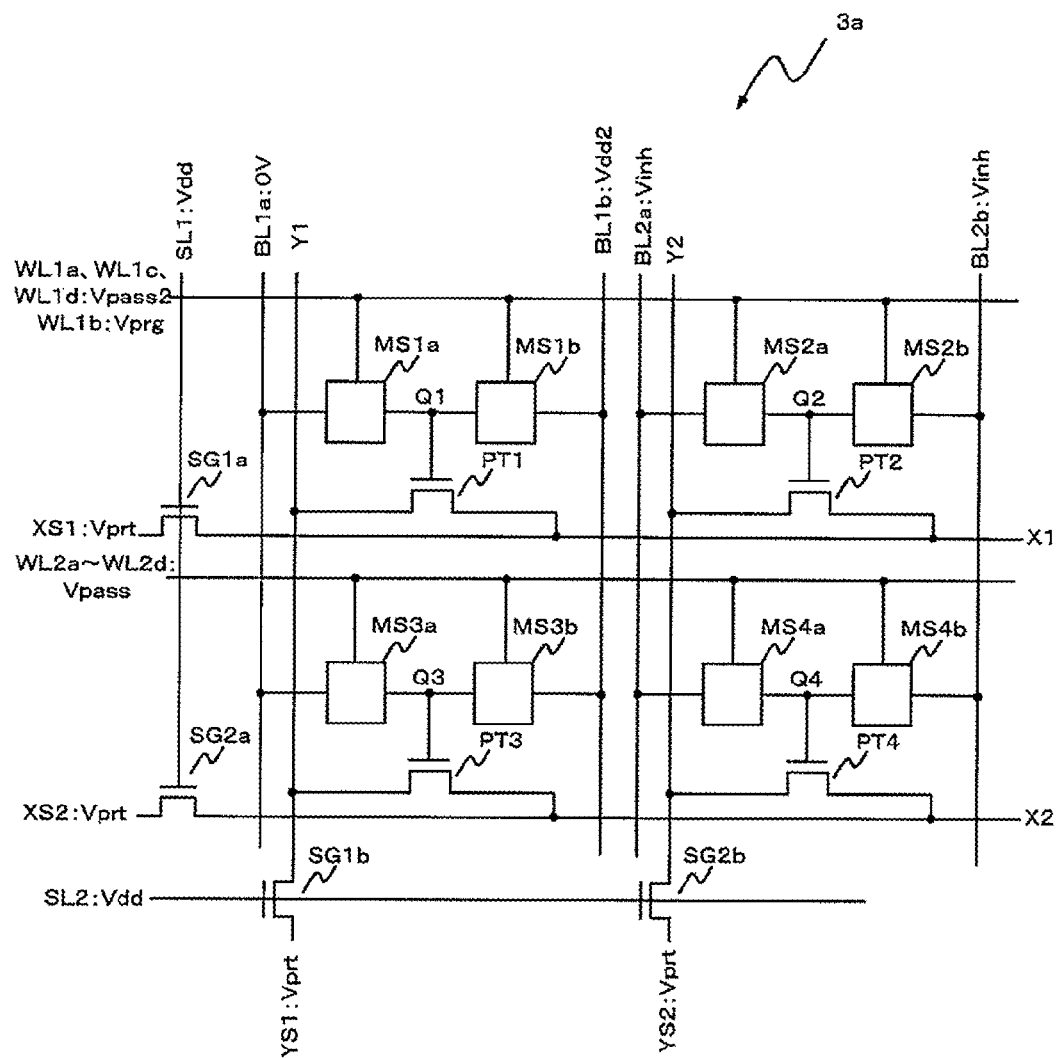
FIG. 16 illustrates voltages applied in a write mode.

FIG. 16 illustrates voltages in the write mode. In the present modification, data-writing is performed using FN tunnel current, similarly to the first and second embodiments. The power-supply voltage Vdd is given to the wires SL1 and SL2 to bring the select gate transistors SG1*a*, SG1*b*, SG2*a* and SG2*b* into ON-state. Then, the breakdown prevent voltage $V_{prt}$ is applied to the wires X1, X2, Y1 and Y2 from the wires XS1, XS2, YS1 and YS2 via the select gate transistors SG1*a*, SG1*b*, SG2*a* and SG2*b*. Consequently, the voltage at the source and the drain of each of the pass transistors PT1 to PT4 can be raised. Also in the present modification, when the programmable logic device 3*a* is in the write mode, all the select gate transistors may be put into ON-state, and the breakdown prevent voltage $V_{prt}$ may be applied to the pass transistors.

Then, the write protect voltage $V_{inh}$ is applied to the bit lines BL2*a* and BL2*b* connected to the unselected second cell. A voltage of 0 V is applied to the bit line BL1*a* connected to the memory transistors of the first cell. The voltage Vdd2 is applied to the bit line BL1*b* for inhibiting writing of data to the memory transistor of the memory string MS1*b*. The voltage Vdd2 is set such that, when the write voltage $V_{prg}$ is applied to the memory transistor MT1*g* of the memory string MS1*b* from the word line WL1*b*, the difference between the write voltage $V_{prg}$ and the voltage Vdd2 is smaller than a voltage difference required to write data using FN tunnel current.

The voltage $V_{pass2}$ is applied to all the word lines WL1*a*, WL1*c* and WL1*d* except for the word line WL1*b* connected to the gate of the writing-target memory transistor MT1*b*. The voltage $V_{pass2}$ is a voltage at which data-writing does not occur even when the memory transistor is in ON-state.

Finally, the write voltage $V_{prg}$ is applied to the word line WL1*b* connected to the gate of the writing-target memory transistor MT1*b* of the memory transistor pair MP2. Consequently, a channel is formed in the memory transistor MT1*b*. Due to a large voltage difference between the channel and the gate of the memory transistor MT1*b*, electrons in the channel are injected into the charge storage film using FN tunnel current. On the other hand, the voltage Vdd2 is applied from the bit line BL1*b* to the memory transistor MT1*g*. Thus, data-writing does not occur. The voltage $V_{pass2}$ is applied to the gates of the non-writing-target memory transistors MT1*a*, MT1*c*, MT1*d*, MT1*e*, MT1*f* and MT1*h* of the memory transistor pairs MP1, MP3 and MP4. The voltage $V_{pass2}$ is lower than the voltage $V_{prg}$. Consequently, data-writing does not occur.

Although a channel is also formed in the memory transistor of the second cell to which the word line WL1*b* is connected, because the write protect voltage $V_{inh}$ is applied to the source and the drain thereof, a voltage difference required to write data using FN tunnel current is not caused between the channel and the gate thereof. Consequently, data is not written thereto.

(Operation Mode)

Figure 17:
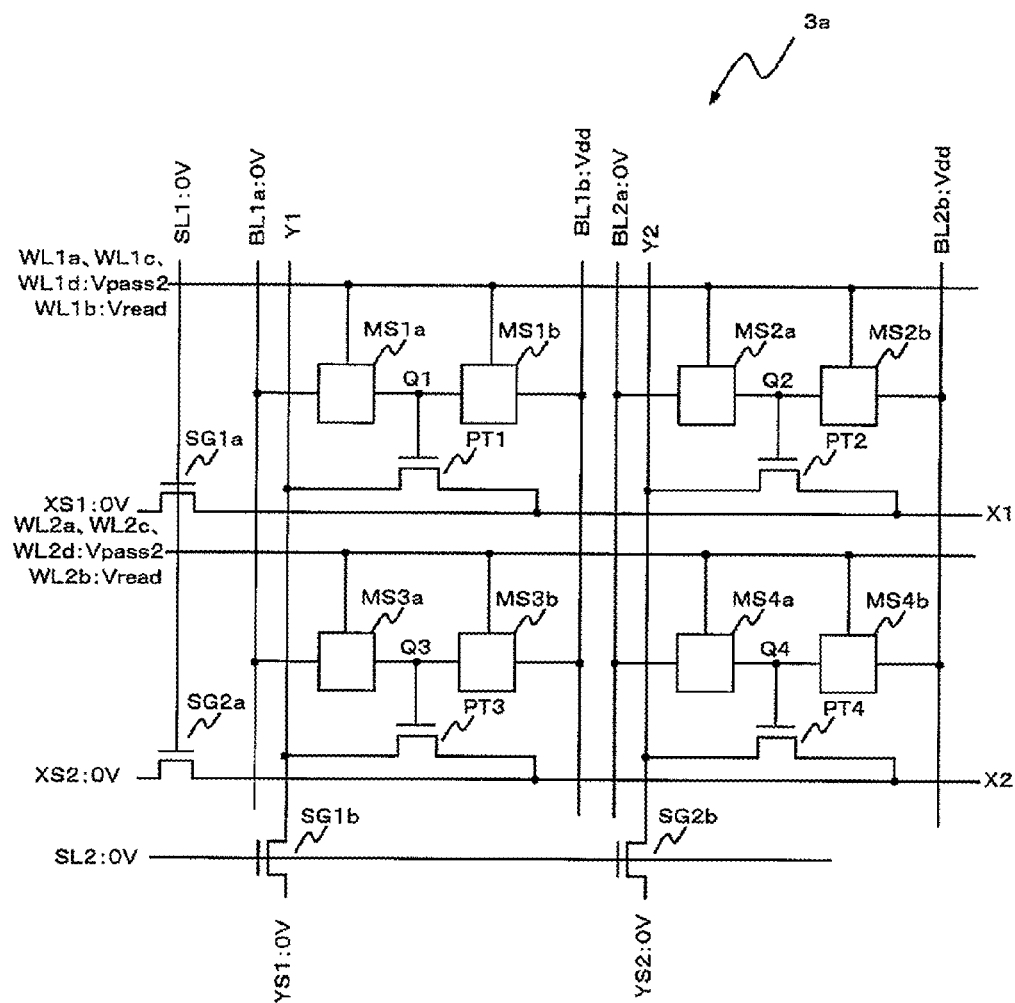
FIG. 17 illustrates voltages applied in an operation mode.

FIG. 17 illustrates voltages applied when the programmable logic device 3*a* is in an operation mode in a case where the memory transistor pair MP2 is selected. When the programmable logic device 3*a* is in an operation mode, a voltage of 0 V is given to the wires SL1 and SL2 to bring the select gate transistors SG1a, SG1b, SG2a and SG2b into OFF-state. Then, a voltage of 0V is given to one of the two bit lines connected to each cell, the power-supply voltage Vdd is given to the other bit line connected to each cell.

There will be exemplified a case where the memory cell transistor MT1b is in a written state and the memory transistor MT1g is an erased state. The voltage $V_{pass2}$ is applied to the word lines WL1a, WL1c and WL1d connected to the unselected memory transistor pairs MP1, MP3 and MP4. The read voltage $V_{read}$ is applied to the word line WL1b connected to the memory transistor pair MP2. Then, the memory transistor MT1b is put into OFF-state, while the memory transistor MT1g is put into ON-state. Thus, the power-supply voltage Vdd is applied to the gate of the pass transistor PT1, so that the pass transistor PT1 is brought into ON-state. Consequently, a signal input to the wire Y1 is output to the wire X1 via the pass transistor PT1.

(Erasure Mode)

When the programmable logic device 3a is in an erasure mode, the select gate transistors SG1a, SG2a, SG1b and SG2b are brought into OFF-state, similarly to the first embodiment. The negative erasure voltage $-V_{prg}$ is applied to all the word lines WL1a to WL1d and WL2a to WL2d. The voltage $V_{ss}$ of e.g., 0V is applied to all the bit lines BL1a, BL1b, BL2a and BL2b. Consequently, all the memory transistors included in the programmable logic device 3a can be put into an erased state.

Fourth Embodiment

Figure 18:
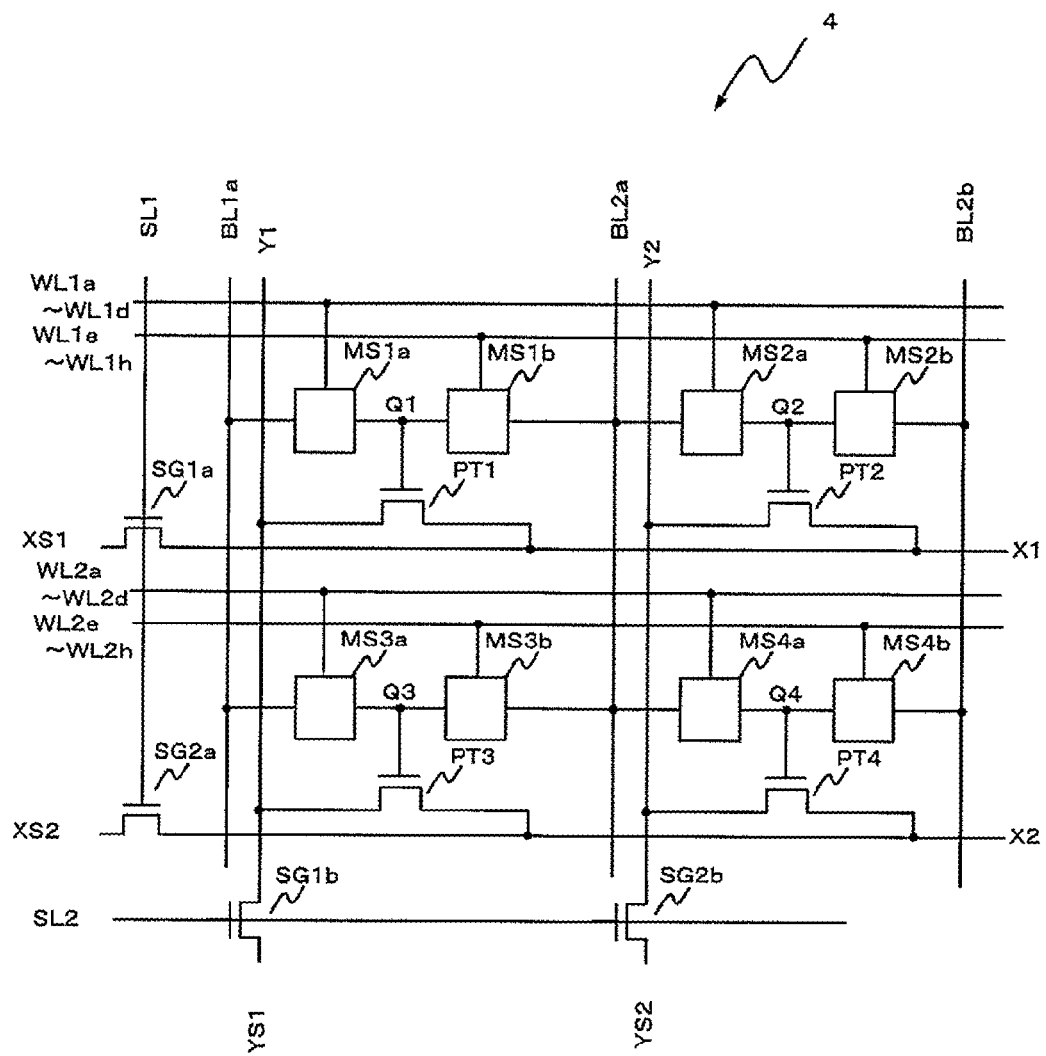
FIG. 18 illustrates a programmable logic device according to a fourth embodiment.

FIG. 18 illustrates a programmable logic device 4 according to a fourth embodiment. In the programmable logic device 4, cells each including two memory strings and one pass transistor are arranged like an array. In the present embodiment, two adjacent cells (e.g., first and second cells/ third and fourth cells) share a bit line. Other components are similar to those of the third embodiment. Because the two adjacent cells share a bit line, the chip area of the programmable logic device 4 can be reduced.

(Write Mode)

In a write mode, one of the memory transistor pairs of the cells is selected. Then, data is written to one of the memory transistors of the selected memory transistor pair. There will be exemplified a case where one MT1b of the memory transistors of the memory transistor pair MP2 is put into a written state and the other memory transistor MT1g is put into an erased state.

Figure 19:
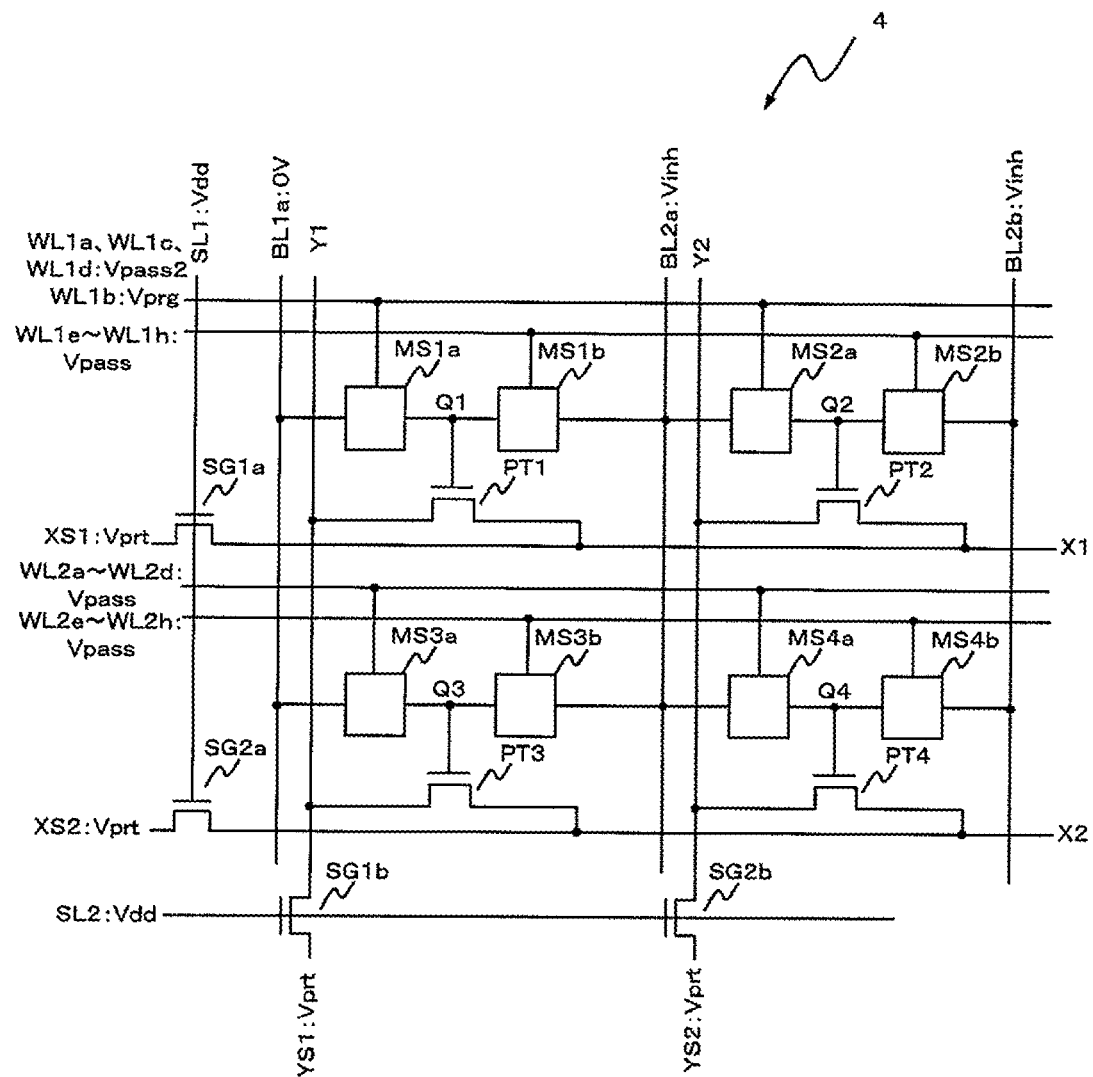
FIG. 19 illustrates voltages applied in a write mode.

FIG. 19 illustrates voltages applied in the write mode. In the present embodiment, the two adjacent cells share a bit line. Thus, the write protect voltage $V_{inh}$ is applied to the bit line BL2a connected to the memory string MS1b. The voltage applied to other wires and the voltage application timing are similar to those according to the third embodiment. The write voltage $V_{prg}$ is applied to the gate of the memory transistor MT1b, and a voltage of 0 V is applied to the source thereof from the bit line BL1a. Consequently, a channel is formed in the memory transistor MT1b. Due to a large voltage difference generated between the channel and the gate thereof, electrons in the channel are injected into the charge storage film using FN tunnel current. On the other hand, the voltage $V_{pass}$ is applied to the gate of the memory transistor of the memory string MS1b. Thus, a channel is not formed therein. Consequently, the data-writing does not occur.

Although a channel is also formed in the memory transistor of the second cell to which the word line WL1b is connected, because the write protect voltage $V_{inh}$ is applied to the source and the drain thereof, a voltage difference required to write data using FN tunnel current is not caused between the channel and the gate thereof. Consequently, data is not written thereto.

(Operation Mode)

Figure 20:
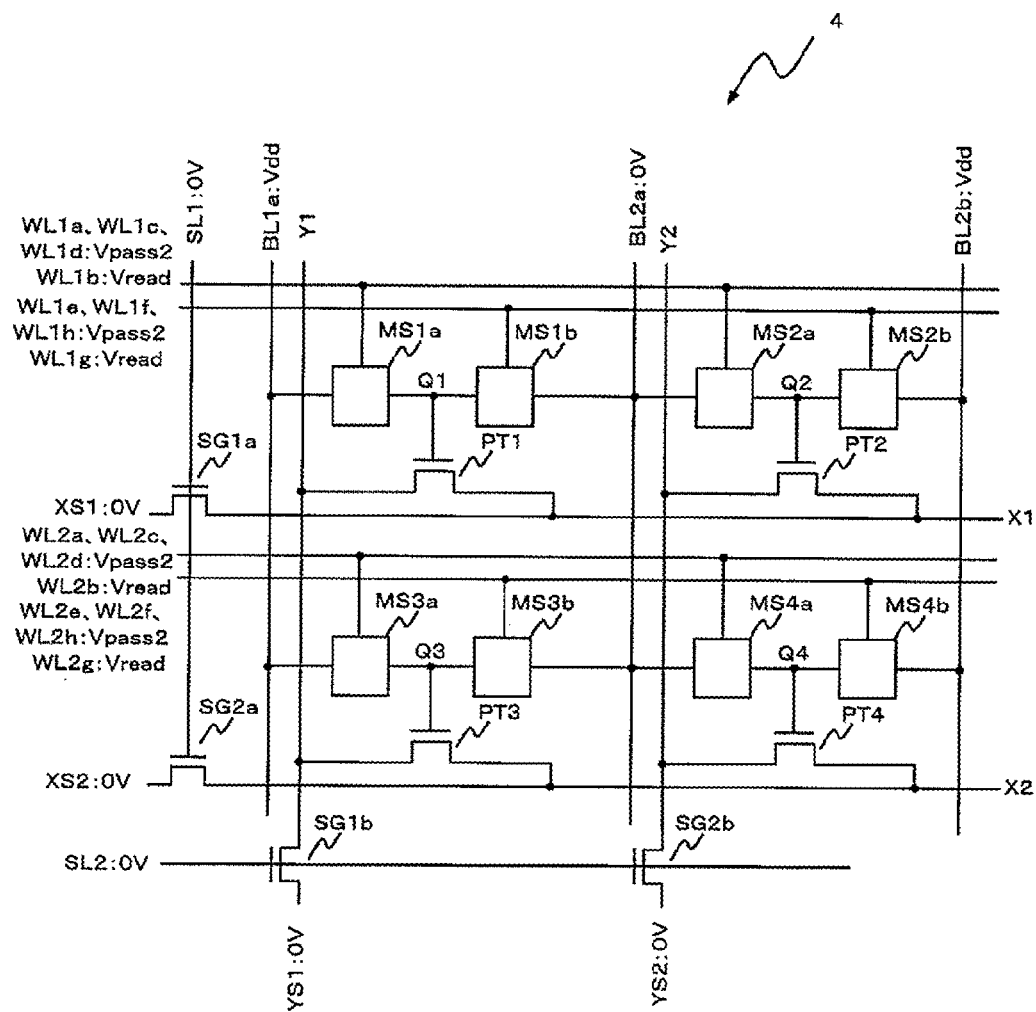
FIG. 20 illustrates voltages applied in an operation mode.

FIG. 20 illustrates voltages applied when the programmable logic device 4 is in an operation mode. When the programmable logic device 4 is in an operation mode, a voltage of 0 V is given to the wires SL1 and SL2 to bring the select gate transistors SG1a, SG1b, SG2a and SG2b into OFF-state. In addition, a voltage of 0 V is given to one of two bit lines connected to each cell, while the power-supply voltage Vdd is given to the other bit line. The voltage $V_{pass2}$ is applied to the word line connected to the unselected memory transistor pairs. In addition, the read voltage $V_{read}$ is applied to the word line connected to the selected memory transistor pair.

In the present embodiment, two adjacent cells share a bit line. Thus, e.g., the voltage Vdd is given to the bit line BL1a, a voltage of 0 V is given to the bit line BL2a, and the voltage Vdd is given to the bit line BL2b. As a result, the programmable logic device 4 can be operated similarly to the programmable logic device 3 according to the third embodiment.

(Erasure Mode)

When the programmable logic device 4 is in an erasure mode, the select gate transistors SG1a, SG2a, SG1b and SG2b are brought into OFF-state, similarly to the third embodiment. Then, the negative erasure voltage $-V_{prg}$ is applied to all the word lines WL1a to WL1d and WL2a to WL2d. The voltage Vss is applied to all the bits lines BL1a, BL1b, BL2a and BL2b. Consequently, all the memory transistors included in the programmable logic device 4 can be put into an erased state.

The fourth embodiment can be modified, similarly to the modification of the third embodiment. Thus, the word line connected to the gates of the paired memory transistors can be shared.

Fifth Embodiment

Figure 21:
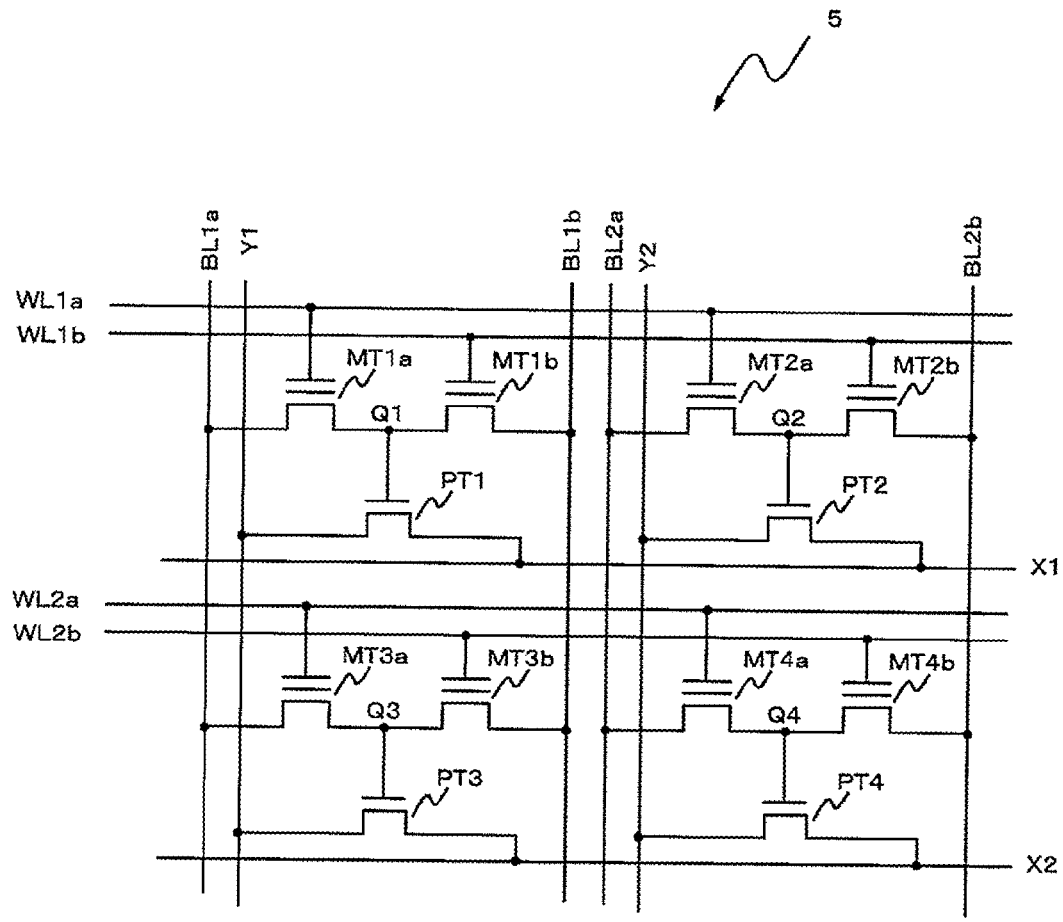
FIG. 21 illustrates a programmable logic device according to a fifth embodiment.

FIG. 21 illustrates a programmable logic device 5 according to a fifth embodiment. The programmable logic device 5 is configured by omitting the select gate transistors SG1a, SG1b, SG2a and SG2b from the programmable logic device 1 according to the first embodiment. Instead, the gate insulating film of the pass transistor of the programmable logic device 5 is set to be thicker than the gate insulating film of the pass transistor of the programmable logic device 1.

(Write Mode)

Figure 22:
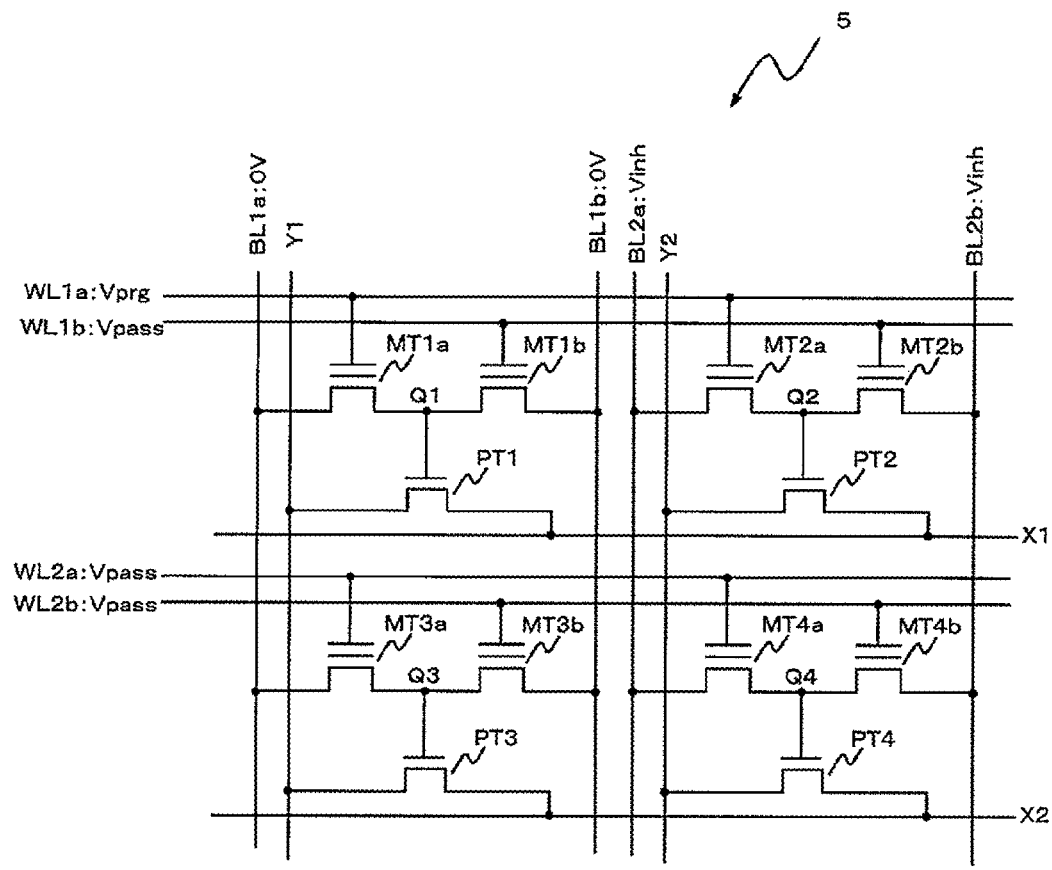
FIG. 22 illustrates voltages applied in a write mode.

FIG. 22 illustrates voltages applied when writing data to one of the memory transistors of the first cell. First, the write protect voltage $V_{inh}$ is applied to the bit lines BL2a and BL2b connected to the memory transistors of the second cell. In addition, a voltage of 0 V is applied to the bit lines BL1a and BL1b connected to the memory transistors of the first cell.

Then, the write voltage $V_{prg}$ is applied to the word line WL1a connected to the gate of the writing-target memory transistor MT1a, while the voltage $V_{pass}$ is applied to the word line WL1b connected to the gate of the non-writing-target memory transistor MT1b. The voltage $V_{pass}$ is so small that no channel is formed. For example, the voltage $V_{pass}$ is 0V As a result, a channel is formed in the memory transistor MT1a, so that large voltage difference is caused between the channel and the gate thereof. Consequently, electrons in the channel are injected into the charge storage film using FN tunnel current. Although a channel is also formed in the memory transistor MT2a of the second cell, a voltage difference between the channel and the gate, which is required to write data using FN tunnel current, is not caused because the write protect voltage $V_{inh}$ is applied to the source and the drain thereof. Therefore, data is not written to the memory transistor MT2a.

The voltage at the gate of each of the memory transistors MT1b and MT2b is 0V. Thus, no voltage difference is caused between the channel and the gate of each of the memory transistors MT1b and MT2b. Accordingly, no data is written to memory transistors MT1b and MT2b.

By applying the voltage $V_{pass}$ to the word lines WL2a and WL2b, writing data to the third cell and the fourth cell can be inhibited.

Thus, in the programmable logic device 5, data can be selectively written to one of the two memory transistors included in one cell. In addition, writing data to the memory transistor which shares the same word line with the writing-target memory transistor can be inhibited.

Next, the range of the write protect voltage $V_{inh}$ and the thickness of the gate insulating film of the pass transistor are described.

As a first condition, in order to prevent the breakdown of the gate insulating film of the pass transistor, the gate insulating film needs to have a withstanding voltage equal to or higher than the difference between the write voltage $V_{prg}$ and the breakdown prevent voltage $V_{prt}$. The $SiO_2$ equivalent thickness $T(SiO_2)$ of the gate insulating film of the pass transistor is expressed by Expression 1 which has been described in the first embodiment.

The write protect voltage $V_{inh}$ is applied to the bit line connected to the source of the memory transistor of the cell to which data is not written. That is, the voltage difference, which is applied to the gate insulating film of the pass transistor of the cell to which data is not written, is $V_{inh}$. Thus, the electric field $E_t$ is obtained by the following expression.

$$E_t = (V_{inh})/T(SiO_2) \quad \text{(Expression 5)}$$

Assuming that the electric field at which the breakdown of the gate insulating film occurs is $E_{BK}$, $E_t$ should be lower than $E_{BK}$.

As a second condition, the write protect voltage $V_{inh}$ to be applied to prevent erroneous writing to a cell to which data is not written. That is, the write protect voltage $V_{inh}$ needs to satisfy the condition expressed by Expression 4 which has been described in the first embodiment.

In general flash memories, the difference between the minimum writing electric-field $E_{lim1}$ and the maximum non-writing electric-field $E_{lim2}$ is about 5 MV/cm. A high voltage is applied to the gate insulating film of the pass transistor only when data is written to the memory transistor. For example, in a flash memory, the electric field applied to the tunnel insulating film is about 20 MV/cm. The upper limit (i.e., the electric field $E_{BK}$ at which the breakdown of the gate insulating film occurs) of the electric field applied to the gate insulating film of the pass transistor is about 10 MV/cm.

In order to assure the high-speed performance of the logic switch, preferably, the thickness of the gate insulating film of the pass transistor is several nanometers (nm). On the other hand, the sum-total thickness of the gate insulating film of the memory transistors is about 15 nm. For example, the sum-total thickness of the gate insulating film of the memory transistor is 13 nm, and when the difference between the minimum writing electric-field $E_{lim1}$ and the maximum non-writing electric-field $E_{lim2}$ is about 5 MV/cm, the write protect voltage Vinh is obtained from Expression 4 as being equal to or higher than 6.5 V. Thus, in order to prevent the breakdown of the gate insulating film of the passing transistor, the necessary thickness of the gate insulating film of the pass transistor is obtained from Expression 5 as being equal to or larger than 6.5 nm.

The operation mode and the erasure mode of the programmable logic device 5 are similar to those of the programmable logic device according to the first embodiment.

Sixth Embodiment

Figure 23:
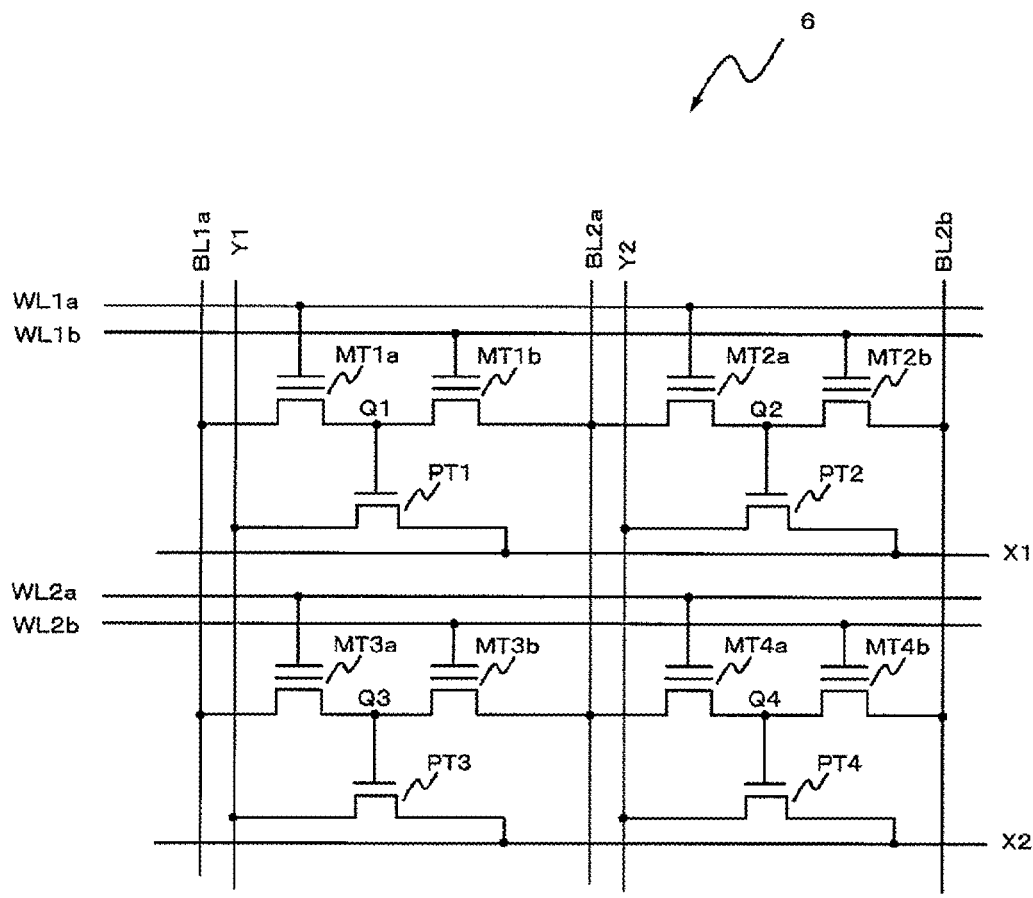
FIG. 23 illustrates a programmable logic device according to a sixth embodiment.
Figure 24:
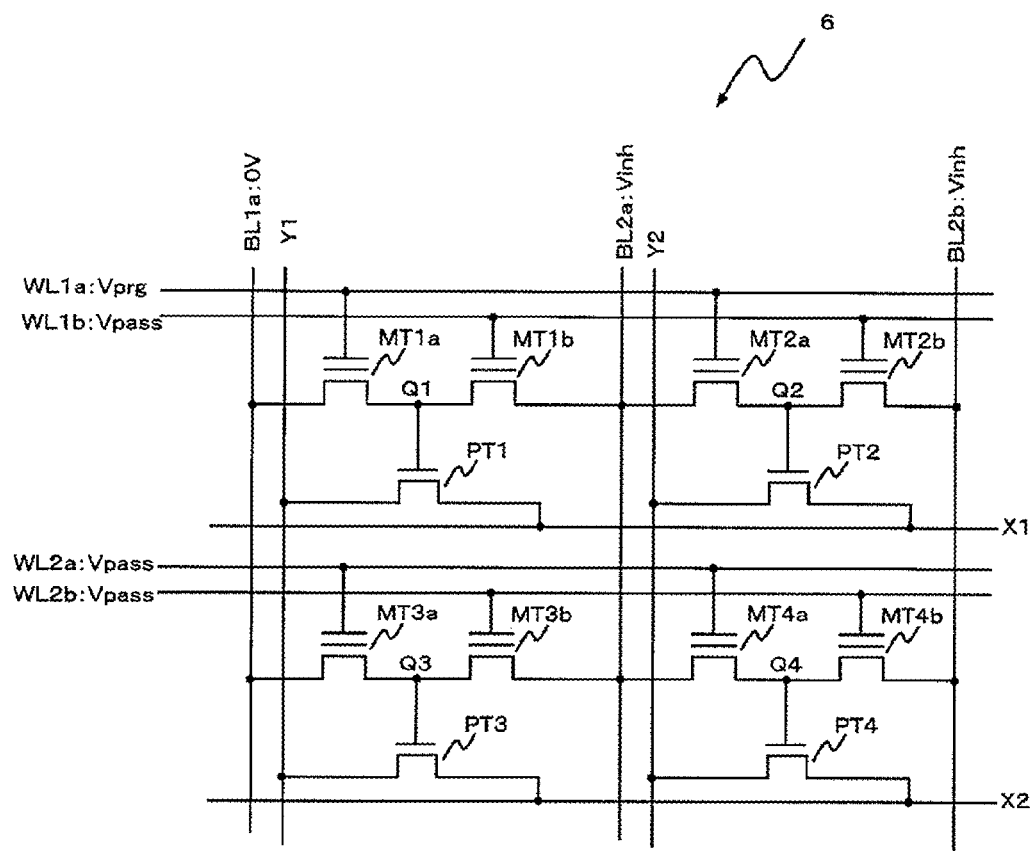
FIG. 24 illustrates voltages applied in an operation mode.

FIG. 23 illustrates a programmable logic device 6 according to a sixth embodiment. In the programmable logic device 6, cells each including two memory transistors and one pass transistor are arranged like an array. In the present embodiment, two adjacent cells (i.e., first and second cells/third and fourth cells) share a bit line. Other components are similar to those of the fifth embodiment. According to the six embodiment, two adjacent cells share a bit line. Consequently, the chip area of the programmable logic device 6 can be reduced. In the present embodiment, by applying voltages as illustrated in FIG. 24, data can be written to the memory transistor MT1a, similarly to the fifth embodiment. Voltage application timing is similar to that according to the fifth embodiment.

The range of the write protect voltage $V_{inh}$, and the thickness of the gate insulating film of the pass transistor are also similar to those according to the fifth embodiment, However, according to the sixth embodiment, because the two adjacent cells share a bit line, the write protect voltage $V_{inh}$ is applied to the source of the memory transistor MT2b and the voltage $V_{pass}$ is applied to the gate thereof when the programmable logic unit 6 is in a write mode. Thus, according to the difference between the write protect voltage $V_{inh}$ and the voltage $V_{pass}$, the memory transistor MT2b may be in ON-state. Accordingly, the range in which selective writing is realized is narrowed.

The operation mode and the erasure mode of the programmable logic device 6 are similar to those according to the second embodiment.

With the above embodiments, the breakdown of the gate insulating film when data is written to the memory transistor can be prevented. According to the first to fourth embodiments, the programmable logic device is provided with the select gate transistors. However, since only one select gate transistor for each of the columns and the rows of the matrix-arranged cells is sufficient, the area of the programmable logic device is not considerably increased.

The invention is not limited to the above embodiments, and can appropriately be modified without departing from the spirit and scope of the invention. For example, the select gate transistors may be memory transistors, instead of logic transistors. That is, the select gate transistors can be configured by transistors similar to the memory transistors (e.g., MT1a, MT1b and the like).

The invention claimed is:
1. A programmable logic device, comprising:
a logic switch;
a first select gate transistor; and
a second select gate transistor,
wherein the logic switch includes:
a first memory having a first terminal connected to a first wire for sending an output signal thereto, a second terminal connected to a second wire for receiving an input signal therefrom, and a third terminal connected to a third wire;
a second memory having a fourth terminal connected to the first wire for sending an output signal thereto, a fifth terminal connected to a fourth wire for receiving an input signal therefrom, and a sixth terminal connected to a fifth wire; and a pass transistor having a gate connected to the first terminal, and a source and a drain respectively connected to a sixth wire and a seventh wire, wherein the first select gate transistor has a source and a drain respectively connected to an eighth wire and the sixth wire, and a gate connected to a ninth wire, and wherein the second select gate transistor has a source and a drain respectively connected to a tenth wire and the seventh wire, and a gate connected to an eleventh wire.

2. The programmable logic device of claim 1, wherein the first memory is a memory transistor having an insulating film configured to store electric-charge, the memory transistor having a drain, a source and a gate as the first to third terminals, respectively, and wherein the second memory is a memory transistor having an insulating film configured to store electric-charge, the memory transistor having a drain, a source and a gate as the fourth to sixth terminals, respectively.

3. The programmable logic device of claim 1, wherein, to write date into the first memory, a write voltage is applied to the third wire, and a first voltage which is lower than the write voltage is applied to the fifth wire.

4. The programmable logic device of claim 3, wherein a plurality of the logic switches are provided, wherein the third wire and the fifth wire of a first one of the logic switches are connected to the third wire and the fifth wire of a second one of the logic switches, respectively, and wherein, to write data into the first one of the logic switches, the first select gate transistor and the second select gate transistor are put into ON-state, a second voltage is applied to the sixth wire and the seventh wire from the eighth wire and the tenth wire, and a third voltage is applied to the second wire and the fourth wire of the second one of the logic switches.

5. The programmable logic device of claim 4, wherein an $SiO_2$ equivalent sum-total thickness $T(SiO_2)$ of a gate insulating film of the pass transistor, the second voltage $V_{prt}$, and the third voltage $V_{inh}$ satisfy:

$$V_{prt} \geq V_{inh} - 10(MV/cm) \times T(SiO_2).$$

6. The programmable logic device of claim 1, wherein, to erase data of the logic switch, the first select gate transistor and the second select gate transistor are put into OFF-state, an erase voltage is applied to the third wire and the fifth wire, and a fourth voltage is applied to the second wire and the fourth wire.

7. The programmable logic device of claim 1, wherein, to operate the logic switch, the first select gate transistor and the second select gate transistor are put into OFF-state, and a read voltage is applied to the third wire and the fifth wire, a fifth voltage is applied to one of the second wire and the fourth wire, and a ground voltage is applied to the other of the second wire and the fourth wire.

8. The programmable logic device of claim 1, wherein a plurality of the logic switches are provided, wherein, in two of the logic switches adjacent in a row direction, the fourth wire of one of the two logic switches is common with the second wire of the other of the two logic switches.

9. The programmable logic device of claim 8, wherein, in the two adjacent logic switches, the fourth wire of the one logic switch and the second wire of the other logic switch are integrally provided as a common wire, and the second wire of the one logic switch and the force wire of the other logic switch are separately provided as non-common wires, and wherein, to write data into the one logic switch, the first select gate transistor and the second select gate transistor are put into ON-state, a second voltage is applied to the sixth wire and the seventh wire from the eighth wire and the tenth wire, and a third voltage is applied to one of the common wire and the non-common wires.

10. A programmable logic device, comprising:

a logic switch;

a first select gate transistor; and a second select gate transistor, wherein the logic switch includes:

a first memory string having a plurality of series-connected memory transistors, one end thereof being connected to a first wire, the other end thereof being connected to a second wire;

a second memory string having a plurality of series-connected memory transistors, the one end thereof being connected to the first wire, the other end thereof being connected to a fourth wire, the memory transistors of the first memory string and the memory transistors of the second memory string being configured to store data complementarily with each other; and a pass transistor having a gate connected to the first wire, and a source and a drain respectively connected to a sixth wire and a seventh wire, wherein the first select gate transistor has a source and a drain respectively connected to the eighth wire and the sixth wire, and a gate connected to a ninth wire, and wherein the second select gate transistor has a source and a drain respectively connected to a tenth wire and the seventh wire, and a gate connected to an eleventh wire.

11. The programmable logic device of claim 10, wherein a plurality of the logic switches are provided, and wherein, to write data into a first one of the logic switches, the first select gate transistor and the second select gate transistor are put into ON-state, a second voltage is applied to the sixth wire and the seventh wire from the eighth wire and the tenth wire, and a third voltage is applied to the second wire and the fourth wire of a second one of the logic switches.

12. The programmable logic device of claim 10, wherein a plurality of the logic switches are provided, wherein, in two of the logic switches adjacent in a row direction, the fourth wire of one logic switch is common with the second wire of the other logic switch.

13. The programmable logic device of claim 10, wherein a plurality of third wires are connected to gates of the memory transistors of the first memory string, and wherein a plurality of fifth wires are connected to gates of the memory transistors of the second memory string.

14. The programmable logic device of claim 13, wherein the first memory string further includes a pair of the control transistors connected to the both ends of the series-connected memory transistors, wherein the second memory string further includes a pair of the control transistors connected to the both ends of the series-connected memory transistors, and wherein the third wires and the fifth wires are made common, respectively.

15. A programmable logic switch comprising a plurality of logic switches,
wherein each logic switch includes:
a first memory transistor having a first drain connected to a first wire for sending an output signal thereto, a first source connected to a second wire for receiving an input signal therefrom, and a first gate connected to a third wire;
a second memory transistor having a second drain connected to the first wire for sending an output signal thereto, a second source connected to a fourth wire for receiving an input signal therefrom, and a second gate connected to a fifth wire; and
a pass transistor having a third gate connected to the first wire, and a third source and a third drain respectively connected to a sixth wire and a seventh wire,
wherein, to write date into a first one of the logic switches, a sixth voltage is applied to the second wire and the fourth wire of a second one of the logic switches, and
wherein an $SiO_2$ equivalent sum-total thickness $T(SiO_2)$ of a gate insulating film of the pass transistor, and the third voltage $V_{inh}$ satisfy:

$V_{inh} \leq 10(MV/cm) \times T(SiO_2)$.

* * * * *